United States Patent
Akiyama

(10) Patent No.: US 10,423,065 B2
(45) Date of Patent: Sep. 24, 2019

(54) PATTERN FORMING METHOD AND PATTERN STRUCTURAL BODY

(71) Applicant: Kabushiki Kaisha Toshiba, Minato-ku (JP)

(72) Inventor: Masahiko Akiyama, Ota (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 197 days.

(21) Appl. No.: 15/267,684

(22) Filed: Sep. 16, 2016

(65) Prior Publication Data

US 2017/0168388 A1    Jun. 15, 2017

(30) Foreign Application Priority Data

Dec. 15, 2015    (JP) ................. 2015-243813

(51) Int. Cl.
| | | |
|---|---|---|
| *G03F 7/00* | (2006.01) | |
| *H01L 51/00* | (2006.01) | |
| *H01L 51/05* | (2006.01) | |

(52) U.S. Cl.
CPC ........ *G03F 7/0002* (2013.01); *H01L 51/0004* (2013.01); *H01L 51/0022* (2013.01); *H01L 51/0545* (2013.01)

(58) Field of Classification Search
CPC ............... G03F 7/0002; H01L 51/0004; H01L 51/0022
See application file for complete search history.

(56) References Cited

U.S. PATENT DOCUMENTS

| | | | | |
|---|---|---|---|---|
| 5,407,733 A | * | 4/1995 | Bjornard | C03C 17/3435 428/216 |
| 7,208,334 B2 | * | 4/2007 | Asakawa | C08F 220/28 257/E21.223 |
| 2002/0151161 A1 | * | 10/2002 | Furusawa | C23C 24/08 438/597 |
| 2005/0087289 A1 | | 4/2005 | Toyoda | |
| 2005/0202348 A1 | | 9/2005 | Nakayama et al. | |

(Continued)

FOREIGN PATENT DOCUMENTS

| | | |
|---|---|---|
| JP | 2000-133571 A | 5/2000 |
| JP | 2002-164635 A | 6/2002 |

(Continued)

*Primary Examiner* — Robert S Walters, Jr.
*Assistant Examiner* — Kristen A Dagenais-Englehart
(74) *Attorney, Agent, or Firm* — Oblon, McClelland, Maier & Neustadt, L.L.P.

(57) ABSTRACT

According to one embodiment, a pattern forming method is disclosed. The method includes preparing a processed body including a substrate having a first face, a first layer provided on the first face, a second layer provided on the first layer, and a photosensitive lyophilic/lyophobic original material provided on the second layer. The method includes performing a first process of irradiating light onto one of a first portion at a first position of the material and a second portion at a second position of the material, and making a first contact angle of a liquid with a first region of an upper face of the processed body relatively larger than a second contact angle of the liquid with a second region of the upper face. The method includes performing a first pattern forming process of forming a first pattern by bringing the liquid into contact with the second region.

8 Claims, 10 Drawing Sheets

(56) References Cited

U.S. PATENT DOCUMENTS

| | | |
|---|---|---|
| 2006/0045963 A1 | 3/2006 | Hirai et al. |
| 2009/0087799 A1 | 4/2009 | Tachibana et al. |
| 2010/0159201 A1 | 6/2010 | Maeda et al. |
| 2011/0014389 A1 | 1/2011 | Ito |
| 2012/0026249 A1 | 2/2012 | Kihira et al. |
| 2012/0252218 A1 | 10/2012 | Kori et al. |
| 2016/0102221 A1 | 4/2016 | Akiyama |

FOREIGN PATENT DOCUMENTS

| | | | | |
|---|---|---|---|---|
| JP | 2004-146478 A | 5/2004 | | |
| JP | 2005-85799 A | 3/2005 | | |
| JP | 2005-289054 A | 10/2005 | | |
| JP | 2006-66673 A | 3/2006 | | |
| JP | 2006-286929 A | 10/2006 | | |
| JP | 2008-4586 A | 1/2008 | | |
| JP | 2008-532059 A | 8/2008 | | |
| JP | 2009-98639 A | 5/2009 | | |
| JP | 2011-91380 A | 5/2011 | | |
| JP | 2012-45539 A | 3/2012 | | |
| JP | 2012-214720 A | 11/2012 | | |
| JP | 5217435 B2 | 6/2013 | | |
| JP | 5417732 B2 | 2/2014 | | |
| JP | 2016-73969 A | 5/2016 | | |
| WO | WO 2006/085220 A2 | 8/2006 | | |
| WO | WO-2006085220 A2 * | 8/2006 | ............ | G03F 7/091 |

* cited by examiner

… (1)

PATTERN FORMING METHOD AND PATTERN STRUCTURAL BODY

CROSS-REFERENCE TO RELATED APPLICATIONS

This application is based upon and claims the benefit of priority from Japanese Patent Application No. 2015-243813, filed on Dec. 15, 2015; the entire contents of which are incorporated herein by reference.

FIELD

Embodiments described herein relate generally to a pattern forming method and a pattern structural body.

BACKGROUND

Various types of patterns are formed on conductors, semiconductors, and insulators in all kinds of electronic equipment. There is a demand for higher pattern accuracy in pattern forming methods and pattern structural bodies. In particular, in pattern forming using printing, the number of processes is reduced compared with photolithography so lower costs can be expected, but forming fine patterns is an issue.

Pattern forming using printing is considered as a method of forming electronic devices at low cost. Printing methods include screen printing, gravure printing, inkjet printing, and the like, but it is difficult to form fine patterns with these printing methods as they are. Therefore, a method of forming fine patterns in which a lyophilic and lyophobic pattern is formed in advance so that the surface of the substrate to be printed has different wettability spatially, and clear pattern boundaries are obtained by printing thereupon with ink. For example, a method in which a surface is made hydrophilic by irradiating a hydrophobic organic layer with ultraviolet light via a photomask, and then, ink is formed on the hydrophilic portion by a dip method or a die coating method to form source and drain electrodes and the like of thin-film transistors is used as a method of forming a lyophilic and lyophobic pattern. Ultraviolet light with short wavelength of 150 to 350 nm may be used, and it is known that processing can be carried out in a short period of time by a combination of ultraviolet irradiation and ozone processing.

However, even though it is possible to adopt the methods of contacting the mask using ultraviolet light of wavelength shorter than 350 nm, it is difficult to combine with a projection optical system, and even if this was possible, there is a problem that the light exposure device would be extremely expensive. In addition, because the contact angle varies, the required light exposure processing time is increased (sensitivity is reduced), and apart from batch process with contact light exposure, it is difficult to process in a practical amount of time. The necessity for the exposure light to contact the mask means that with plastics for the substrate that deform, pattern alignment is difficult, so it is necessary to increase the design margin in accordance with the amount of deformation, so there is the problem that it is not possible to form patterns with high fineness (high degree of integration). Also, when ozone processing is combined with light irradiation, the contact angle at the interfaces of the pattern varies gently due to diffusion of the ozone, so there is a problem that it is not possible to form a fine pattern.

A method in which a hydrophobic layer is formed on a light absorbent layer, which is then irradiated with light so that the light absorbent layer generates heat, and the hydrophobic layer is decomposed to become hydrophilic by the heat energy has been proposed. Because heat is used, laser light which has high energy density must be used, and because of the heat, there is diffusion at the irradiation interfaces, so there is a problem that the interfaces between the lyophilic and lyophobic patterns are not sharp.

DETAILED DESCRIPTION

Figure 1A:
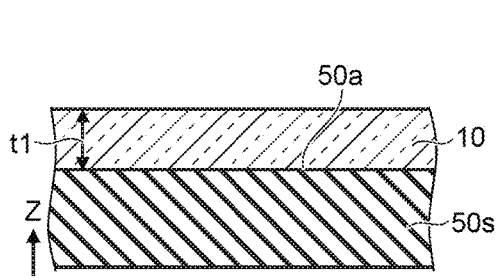
FIG. 1A to FIG. 1G are schematic cross-sectional views of a processing procedure showing a pattern forming method according to a first embodiment.

According to one embodiment, a pattern forming method is disclosed. The method includes preparing a processed body including a substrate having a first face, a first layer provided on the first face, a second layer provided on the first layer, and a photosensitive lyophilic/lyophobic original material provided on the second layer. The first layer includes an upper region in contact with the second layer and has a first refractive index, and the second layer has a second refractive index different from the first refractive index. The method includes performing a first process of irradiating light onto one of a first portion at a first position of the photosensitive hydrophilic/hydrophobic original material and a second portion at a second position of the photosensitive hydrophilic/hydrophobic original material, and making a first contact angle of a liquid with a first region of an upper face of the processed body relatively larger than a second contact angle of the liquid with a second region of the upper face. The second position is alongside the first position in a direction along the first face. The first region overlaps the first position in a first direction perpendicular to the first face, and the second region overlaps the second position in the first direction. In addition, the method includes performing a first pattern forming process of forming a first pattern by bringing the liquid into contact with the second region. The first pattern includes at least a portion of the first region and the liquid on at least a portion of the second region.

According to one embodiment, a pattern forming method is disclosed. The method includes preparing a processed body including a substrate having a first face, a first layer provided on the first face and having a first refractive index, and a second layer provided on the first layer and having a second refractive index different from the first refractive index. The method includes performing a first process of irradiating light onto one of a first portion at a first position of the second layer and a second portion at a second position of the second layer, and making a first contact angle of a liquid with a first region of an upper face of the processed body relatively larger than a second contact angle of the liquid with a second region of the upper face. The second position is alongside the first position in a direction along the first face. The first region overlaps the first position in a first direction perpendicular to the first face, and the second region overlaps the second position in the first direction. In addition, the method includes performing a first pattern forming process of forming a first pattern by bringing the liquid into contact with the second region. The pattern includes at least a portion of the first region and the liquid on at least a portion of the second region.

According to one embodiment, a pattern structural body includes a substrate having a first face, a first layer provided on the first face and having a first refractive index, a second layer provided on the first layer and having a second refractive index different from the first refractive index, and a pattern including a first region and a second region provided on the second layer. A contact angle of a liquid on the first region is larger than a contact angle of the liquid on the second region. An attenuation rate of the first layer with respect to a light is not less than 50%. A wavelength of the light is not more than 370 nm.

Various embodiments will be described hereinafter with reference to the accompanying drawings.

The drawings are schematic and conceptual, and the relationships between the thickness and width of portions, the size ratio among portions, etc., are not necessarily the same as the actual values thereof. Further, the dimensions and proportions may be illustrated differently among drawings, even for identical portions.

In the present specification and drawings, the same elements as those described previously with reference to earlier figures are labeled with like reference numerals, and the detailed description thereof is omitted as appropriate.

(First Embodiment)

FIG. 1A to FIG. 1G are schematic cross-sectional views of a processing procedure illustrating a pattern forming method according to a first embodiment.

These drawings illustrate a first method PR1 of a pattern forming method according to the embodiment. As shown in FIG. 1A, in the pattern forming method according to the embodiment, a substrate 50s is prepared. The substrate 50s is, for example, a plastic substrate. The substrate 50s includes, for example, a resin. The substrate 50s has a first face 50a. The first face 50a is, for example, the upper face (for example, a major face) of the substrate 50s. The Z-axis direction is defined as being the direction perpendicular to the first face 50a.

A first layer 10 is formed on the first face 50a. The first layer 10 is, for example, an organic layer. The first layer 10 includes, for example, an organic material. The thickness of the first layer 10 (thickness in the Z-axis direction) is taken to be a first thickness t1. The first layer 10 has, for example, a first refractive index. The first layer 10 spreads along a surface perpendicular to the Z-axis direction.

Figure 1E:
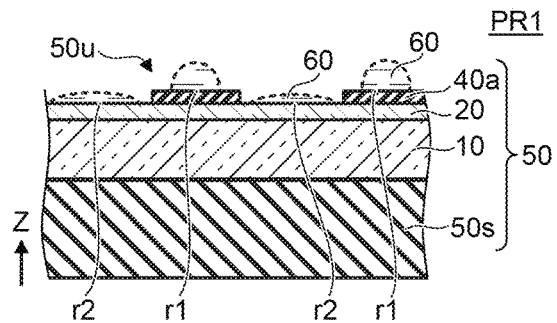
Figure 1B:
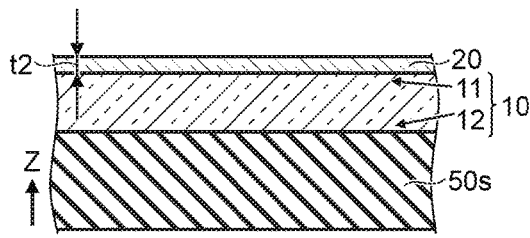

As shown in FIG. 1B, a second layer 20 is formed on the first layer 10. The second layer 20 is, for example, an organic layer. The second layer 20 includes, for example, an organic material. The thickness of the second layer 20 (thickness in the Z-axis direction) is taken to be a second thickness t2. In this example, the second thickness t2 is less than the first thickness t1. The second layer 20 has, for example, a second refractive index. The second refractive index is different from the first refractive index. The second layer 20 is substantially parallel to the first layer 10.

In the embodiment, the first layer 10 has an upper region 11 in contact with the second layer 20. For example, the upper region 11 has the first refractive index. The first layer 10 may have a region (substrate side region 12) that is different from the upper region 11. The substrate side region 12 is provided between the upper region 11 and the substrate 50s. The upper region 11 is provided between the substrate side region 12 and the second layer 20. The refractive index of the substrate side region 12 may be the same as the first refractive index of the upper region 11, or it may be different. The substrate side region 12 may be continuous with the upper region 11, or it may be discontinuous. In the embodiment, the upper region 11 layer and the substrate side region 12 layer are provided in the first layer 10, and the materials of these layers may be different from each other. In the following, a case is described in which the characteristics of the first layer 10 are uniform throughout the whole first layer 10.

Figure 1F:
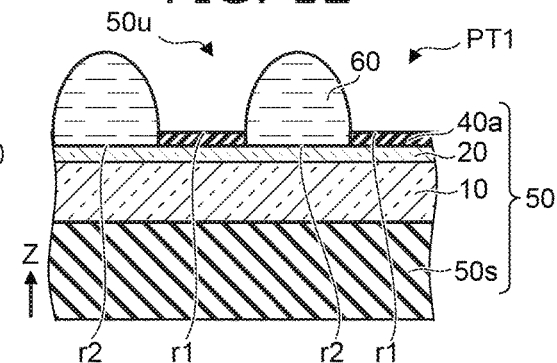
Figure 1C:
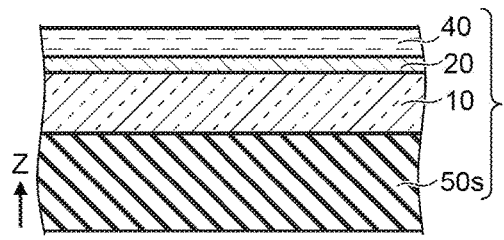

As shown in FIG. 1C, a photosensitive lyophilic/lyophobic base material 40 (for example, a third layer) is formed on the second layer 20. The photosensitive lyophilic/lyophobic base material 40 is photosensitive. When light is irradiated onto the photosensitive lyophilic/lyophobic base material 40, the characteristics of the photosensitive lyophilic/lyophobic base material 40 are changed. The light is used in the pattern forming as described later. The light is, for example, ultraviolet light. The wavelength of the light is, for example, 365 nm±20 nm. The wavelength of the light may be, for example, not shorter than 300 nm and not greater than 410 nm. The photosensitive lyophilic/lyophobic base material 40 may, for example, be in a solid state, or may be in a liquid state. The lyophilic/lyophobic base material 40 (layer) is a material (layer) that forms a lyophobic layer or a lyophilic layer as a result of irradiation with light. The lyophilic/lyophobic base material 40 (layer) is the material or layer prior to change of the molecular structure and form. The lyophilic/lyophobic base material 40 (layer) is, for example, an unreacted layer. The lyophilic/lyophobic base material 40 (layer) is, for example, an unhardened layer.

In this way, in the embodiment, a processed body 50 is prepared. The processed body 50 includes the substrate 50s having the first face 50a, the first layer 10 provided on the first face 50a, the second layer 20 provided on the first layer 10, and the photosensitive lyophilic/lyophobic base material 40 provided on the second layer 20. The pattern forming method according to the embodiment may include forming the processed body 50. In some cases, the processed body 50 includes the substrate 50s having the first face 50a, the first layer 10 provided on the first face 50a, the second layer 20 provided on the first layer 10, and a layer formed from the photosensitive lyophilic/lyophobic base material 40 provided on the second layer 20.

Figure 1G:
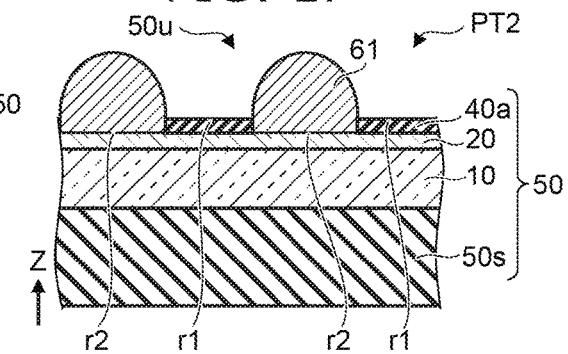
Figure 1D:
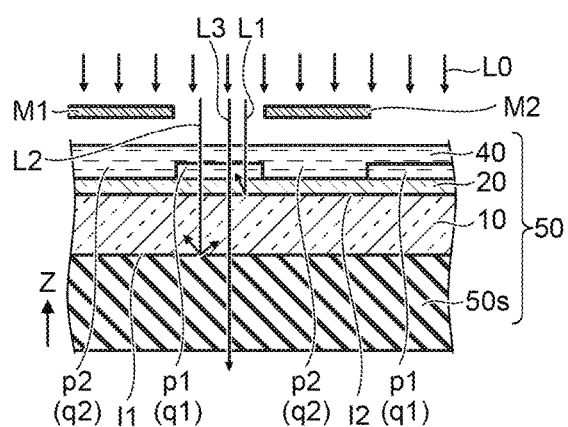

As shown in FIG. 1D, light L0 is selectively irradiated onto a portion of the photosensitive lyophilic/lyophobic base material 40. For example, the photosensitive lyophilic/lyophobic base material 40 includes a first portion p1, and a second portion p2. The photosensitive lyophilic/lyophobic base material 40 has a first position q1, and a second position q2. The second position q2 is alongside the first position q1 in a direction along the first face 50a. The first portion p1 is provided at the first position q1 on the photosensitive lyophilic/lyophobic base material 40. The second portion p2 is provided at the second position q2 on the photosensitive lyophilic/lyophobic base material 40. One of the first portion p1 and the second portion p2 is irradiated with the light L0. In this example, a mask M1 is used. The mask M1 has an opening M2. In this example, the opening M2 overlaps the first position q1 of the first portion p1. A light shielding part (non-opening part) overlaps the second position q2 of the second portion p2. As a result, in this example, the first portion p1 is irradiated with light. In the embodiment, irradiating with light may be carried out by scanning the light and the like. For example, an ultra high pressure mercury lamp or an ultraviolet LED or the like can be used as the light source of the light used in scanning. The light may, for example, be spatially modulated using a two-dimensional light modulator (for example, a DMD or the like) without using a mask, and irradiated onto the substrate with, for example, a projection lens. The method by which the light L0 is irradiated onto one of the first portion p1 and the second portion p2 is optional.

In the first method PR1, the photosensitive lyophilic/lyophobic base material 40 is a negative type. In the photosensitive lyophilic/lyophobic base material 40, for example, polymerization is promoted in the portion that is irradiated with the light L0. In this example, the chemical resistance of the first portion p1 is higher than the chemical resistance of the second portion p2. The first portion p1 is more difficult to dissolve than the second portion p2.

The photosensitive lyophilic/lyophobic base material 40 is processed with a chemical solution. For example, the second portion p2 is removed. The second portion p2 may be removed by heating or by reducing the pressure. On the other hand, the first portion p1 of the photosensitive lyophilic/lyophobic base material 40 remains. For example, a lyophobic layer is formed by the first portion p1. For example, a solidified (for example, hardened) lyophilic/lyophobic layer is formed from the lyophilic/lyophobic base material 40 by polymerization or the like. In this case, the modified layer is the first portion p1. Likewise with the following description.

As shown in FIG. 1E, a layer 40a formed from the photosensitive lyophilic/lyophobic base material 40 remains. In this example, the first portion p1 which is a layer formed on a portion of the second layer 20 remains. In the region where the second portion p2 has been removed, the surface of the second layer 20 is exposed. In the first method PR1, the surface energy of the formed layer that is the first portion p1 is different from the surface energy of the second layer 20. In this example, the contact angle of a liquid 60 on the first portion p1 that is the formed layer is larger than the contact angle of the liquid 60 on the surface of the second layer 20.

In this way, on an upper surface 50u of the processed body 50, a plurality of regions is formed (first region r1 and a second region r2) having different surface energies from each other. In this example, the first region r1 corresponds to the surface of the first portion p1. The second region r2 corresponds to the surface of the second layer 20 that is exposed when the second portion p2 is removed.

In the embodiment, a first contact angle of the liquid 60 on the first region r1 of the upper surface 50u of the processed body 50 is made relatively larger than a second contact angle of the liquid 60 on the second region r2 of the upper surface 50u. The first region r1 overlaps the first position q1 of the first portion p1 in a first direction (Z-axis direction) perpendicular to the first face 50a. The second region r2 overlaps the second position q2 of the second portion p2 in the first direction.

The liquid 60 is, for example, ink. FIG. 1E illustrates an example of the difference in characteristics (contact angle) of the first region r1 and the second region r2 of the upper surface 50u of the processed body 50 by drawing temporarily placed liquid 60. In the process illustrated in FIG. 1E, the liquid 60 need not be provided on the upper surface 50u.

As shown in FIG. 1F, a first pattern PT1 is formed by bringing the liquid 60 into contact with the second region r2. At this time, in addition to the second region r2, the liquid 60 may also temporarily contact with at least a portion of the first region r1. For example, the liquid 60 is coated on the upper surface 50u of the processed body 50. For example, the coating is carried out by a method such as printing or the like. In this example, the liquid 60 is not substantially provided on the first region r1 (first portion p1) which has a relatively large contact angle. The liquid 60 is provided on the second region r2 (surface of the second layer 20) which has a relatively small contact angle. The first pattern PT1 is formed as a result of this difference. In this example, the first pattern PT1 includes at least a portion of the first region r1 and the liquid 60 on at least a portion of the second region r2. The first pattern PT1 is a patterned structural body.

As shown in FIG. 1G, in addition, a solid 61 is formed from at least a portion of the liquid 60 on at least a portion of the second region r2. For example, at least any one of annealing, a drying process, plasma irradiation, and light irradiation is carried out. In this way, a second pattern PT2 that includes the solid 61 is formed. The solid 61 is any one of, for example, a conductor, a semiconductor, and an insulator. For example, the solid 61 is a portion of an electronic device. The solid 61 includes, for example, a functional pattern such as a conductor pattern or the like.

In the embodiment, as shown in FIG. 1D, of the light L0, first light L1 is incident on the photosensitive lyophilic/lyophobic base material 40, and passes through the second layer 20. In the embodiment, the second refractive index of the second layer 20 is different from the refractive index of the first layer 10. Therefore, a portion of the first light L1 that passed through the second layer 20 is reflected at an interface 12 between the second layer 20 and the first layer 10. The reflected first light L1 is incident on the first portion p1 of the photosensitive lyophilic/lyophobic base material 40. In this way, the light L0 from above and a portion of the first light L1 that is reflected at the interface 12 from below are incident on the first portion p1. As a result, the reaction of the first portion p1 is further promoted based on the light. The sensitivity of the photosensitive lyophilic/lyophobic base material 40 is substantially increased.

For example, in the photosensitive lyophilic/lyophobic base material 40, it has been found that the light from the lower surface is more effective in photoreactive solidification. This is because the mechanism is growth of the film from the lower surface on the substrate side, and sensitivity to the reaction to form the film is higher with light from the lower surface. Also, by absorbing the light L0, a reaction is produced based on the light L0. Therefore, as the light L0 is passing through the photosensitive lyophilic/lyophobic base material 40, the intensity of the light L0 is reduced. For example, in the vicinity of the upper surface of the photosensitive lyophilic/lyophobic base material 40 (the face at which the light L0 is incident), the intensity of the light L0 is sufficiently high. On the other hand, at the portion on the lower surface side of the photosensitive lyophilic/lyophobic base material 40, the state is produced that the intensity of the light L0 is insufficient due to absorption of the light L0.

In the embodiment, for example, the light L0 is reflected at the interface I2 between the second layer 20 and the first layer 10. The light L0 from above and a portion of the first light L1 that is reflected at the interface I2 from below are incident on the first portion p1. In this way, the insufficiency of the intensity of the light L0 at the portion of the photosensitive lyophilic/lyophobic base material 40 on the lower surface side is suppressed. The reaction of the first portion p1 is further promoted based on the light, and the sensitivity of the photosensitive lyophilic/lyophobic base material 40 is substantially increased. In this way, high accuracy can be obtained in the first pattern PT1 that includes the first region r1 and the second region r2. In this way, high accuracy can be obtained in the second pattern PT2.

On the other hand, second light L2, which is another portion of the light L0, is incident on the photosensitive lyophilic/lyophobic base material 40, passes through the second layer 20, and is incident on the first layer 10. The second light L2 is, for example, reflected at an interface I1 between the first layer 10 and the substrate $50s$. For example, frequently, the flatness of the surface (first face $50a$) of the substrate $50s$ is low. When the second light L2 that is incident on the first layer 10 is reflected at the interface I1, for example, it is scattered due to the irregularity of the first face $50a$. In addition, the second light L2 passes through the substrate $50s$. In this case, it is scattered due to the turbidity of the substrate as the substrate is plastic. Also, fluorescence may be generated depending on the material, and the fluorescent light has the same angle as the scattered light. Also, when the substrate $50s$ is a plastic substrate or similar, in some cases, the first face $50a$ is a curved surface. In this case, the second light L2 may be at an inclination with respect to the first face $50a$. The direction of the second light L2 that is reflected at the first face $50a$ is inclined. The second light L2 is reflected at the rear surface of the substrate $50s$, and after passing through the substrate $50s$ is reflected at a stage or the like. The light due to these factors is generically referred to as "scattered and other light".

"Scattered and other light" includes light reflected at the interface I1, light scattered due to the low flatness of the substrate surface, light scattered due to the turbidity of the substrate itself, fluorescent light of the substrate material, inclined light when the surface is curved, and the like. "Scattered and other light" includes light scattered within the first layer 10 as described later. In addition, "scattered and other light" may also include, for example, all of the second light L2 whose direction has changed and has reached the second portion p2.

With a portion of the second light L2 that has passed through the hydrophobic base material 40 and has become scattered and other light, in some cases, the extension line of its direction of travel overlaps the second portion p2. When the second light L2 is incident on the second portion p2 due to scattered and other light, a reaction proceeds on the second portion p2 due to the light. As a result, for example, the contact angle with the liquid 60 increases in the second region r2.

In the embodiment, when the first layer 10 has light attenuation properties, the second light L2 is attenuated in the first layer 10. For example, when the second light L2 is proceeding from the second layer 20 toward the first face $50a$, a portion of the second light L2 is attenuated in the first layer 10. As a result, the quantity of the second light L2 arriving at the interface I1 is reduced. In addition, the second light L2 that arrives at the interface I1 and is reflected at the interface I1 is absorbed by the first layer 10. Therefore, the second light L2 that is reflected at the interface I1 and travels at an inclined direction and that is incident on the second portion p2 is suppressed. Note that the case in which the first layer 10 has light absorption properties has been described, but the first layer 10 may also reflect light. In this case also, the light incident on the second portion p2 is suppressed. The same applies in the case that the second light L2 arrives within the substrate $50s$ and below. In other words, when the direction of the light has changed due to scattered and other light, the quantity of light incident on the second portion p2 is suppressed by the first layer 10. For example, light is attenuated by the first layer 10 having light absorption properties.

For example, the attenuation rate of the first layer 10 with respect to the light L0 is not lower than 30%. For example, the attenuation rate of the first layer 10 with respect to the light L0 is higher than the attenuation rate of the second layer 20 with respect to the light L0. For example, the transmittance of the first layer 10 with respect to the light L0 is lower than the transmittance of the second layer 20 with respect to the light L0.

The first layer 10 has, for example, light absorbing properties. The first layer 10 may also reflect light. In this case also, the light incident on the second portion p2 is suppressed. The light incident on the second portion p2 is suppressed by providing the first layer 10 with the property that light passing through it is attenuated. As a result, for example, the increase in the contact angle with the liquid 60 in the second region r2 is suppressed, so the pattern accuracy is improved.

In the embodiment, for example, a first absorption rate of the first layer 10 with respect to the light L0 is preferably higher than a second absorption rate of the second layer 20 with respect to the light L0. As a result, the input of the second light L2 that is reflected at the interface I1 into regions where it is not desirable is suppressed. In this way, the accuracy of the pattern is improved.

The first light L1 is reflected at the interface I2 between the first layer 10 and the second layer 20 as described above. For example, when the flatness of the interface I2 is low and the like, scattering is produced. In some cases, as a result of reflection, the direction of travel of the reflected first light L1 is inclined. For example, in the embodiment, the first thickness t1 of the first layer 10 is small. In this way, the incidence of the reflected and inclined first light L1 onto the second portion p2 is suppressed. In the embodiment, preferably, the second layer 20 is thin. For example, the second thickness t2 of the second layer 20 is less than the first thickness t1 of the first layer 10. In this way, the accuracy of the pattern is improved.

As described above, in the embodiment, a first process (the processes illustrated in FIG. 1D and FIG. 1E) is provided. In this process, one of the first portion p1 and the second portion p2 of the photosensitive lyophilic/lyophobic base material 40 is irradiated with the light L0. Then, the first contact angle with the liquid 60 on the first region r1 of the upper surface 50u of the processed body 50 is made relatively larger than the second contact angle with the liquid 60 on the second region r2 of the upper surface 50u. The first region r1 overlaps the first portion p1 in the Z-axis direction, and the second region r2 overlaps the second position q2 of the second portion p2 in the Z-axis direction.

In the first method PR1, the light L0 is irradiated onto the first portion p1. The first process includes hardening at least a portion of the first portion p1. In the first method PR1, the first process may further include a removing process of removing at least a portion of the second portion p2 after irradiation. The first portion p1 that has been irradiated with the light L0 remains, and the first contact angle on the first region r1 that overlaps the first position q1 of the first portion p1 is larger than the second contact angle on the second region r2 (surface of the second layer 20) that overlaps the second position q2 of the second portion p2.

As shown in FIG. 1D, in the embodiment, third light L3, which is another portion of the light L0, passes through the photosensitive lyophilic/lyophobic base material 40, the second layer 20, and the first layer 10, and may be incident on the substrate 50s. A portion of the third light L3 may pass through the substrate 50s.

Figure 2:
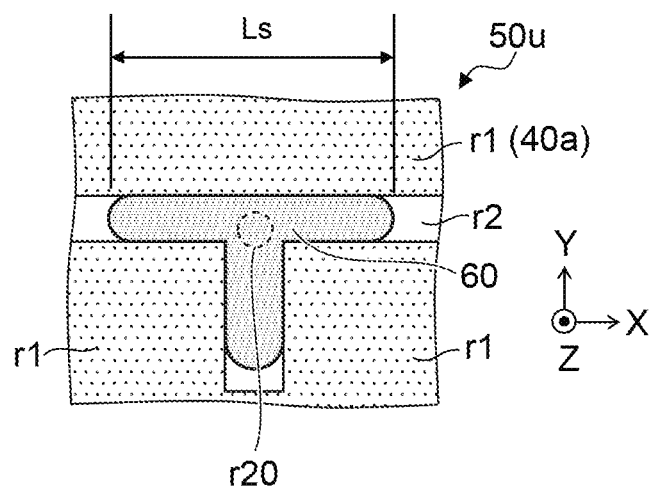
FIG. 2 is a schematic view showing the characteristics of the pattern.

FIG. 2 is a schematic view illustrating the characteristics of the pattern.

FIG. 2 is a plan view illustrating a test specimen. FIG. 2 illustrates the test specimen in the status indicated in FIG. 1F.

As shown in FIG. 2, one direction perpendicular to the Z-axis direction (the direction perpendicular to the first face 50a) is defined as the X-axis direction. The direction perpendicular to the Z-axis direction and the X-axis direction is defined as the Y-axis direction.

As shown in FIG. 2, in the upper surface 50u of the processed body 50, the first region r1 and the second region r2 are provided. The first region r1 corresponds to the surface of the layer 40a formed from the photosensitive lyophilic/lyophobic base material 40, and corresponds to the surface of the first portion p1. The second region r2 corresponds to the surface of the second layer 20 that is exposed when the second portion p2 is removed. In this test, the plan shape of the second region r2 is a "T-shape". A portion of the second region r2 extends in the X-axis direction. A portion of the second region r2 extends in the Y-axis direction. At the intersection point r20 of these portions, a drop of the liquid 60 is disposed. The drop spreads along the surface of the second region r2. The liquid 60 is repelled at the first region r1. The liquid 60 does not spread onto the first region r1.

In this test, a PEN film is used as the substrate 50s. A film in which an ultraviolet absorbing group is incorporated into an acrylic resin is used as the first layer 10. The refractive index of the first layer 10 is 1.50. The thickness of the first layer 10 is from 3 μm to 20 μm. Here, a polystyrene resin that does not include fluorine is used as the second layer 20. The refractive index of the second layer 20 is 1.55. The thickness of the second layer 20 is from about 10 nm to 2 μm. A photo-hardening material is used as the photosensitive lyophilic/lyophobic base material 40. The photo-hardening material is a lyophobic film having a group that includes fluorine and that can be hardened with light of wavelength 365 nm. The thickness of the material of the photosensitive lyophilic/lyophobic base material 40 is from 50 nm to 500 nm. The thickness of the layer 40a formed from the photosensitive lyophilic/lyophobic base material 40 is from about 10 nm to 100 nm. In the test, the width along the Y-axis direction of the second region r2 that extends in the X-axis direction is 20 μm.

In the test, tetradecane solvent Ag nano ink is used as the liquid 60. The drop of the liquid 60 is disposed at the point of intersection r20 by the inkjet method. The number of drops disposed at the point of intersection r20 is one. The volume of the one drop is 1 picoliter. In the test, two types of test specimen are produced. In a first test specimen, the first layer 10 and the second layer 20 as described above are provided on the substrate 50s. On the other hand, in a second test specimen, the second layer 20 is directly provided on the substrate 50s, without providing the first layer 10.

In the second test specimen, there is slight wetting and spreading of the liquid 60. The liquid 60 remains in the vicinity of the point of intersection r20. In contrast, in the first test specimen, the liquid 60 wets and spreads along the second region r2 in a "T-shape". In the first test specimen, the distance of wetting and spreading of the liquid 60 is long.

The contact angle of the second test specimen on the second region r2 is considered to be larger than the contact angle of the first test specimen on the second region r2.

In the second test specimen, where the first layer 10 is not provided, for example, the second light L2 as indicated in FIG. 1D is subject to light scattering when it has passed through the second layer 20 and has reached the substrate 50s. The scattering includes, for example, scattering at the interface between the substrate 50s and the second layer 20, scattering within the substrate 50s, diffuse reflection at the rear surface of the substrate 50s, and fluorescent light from the substrate 50s. In addition, it includes combinations of these effects. Therefore, it is considered that a portion of the light is incident on the lower side of the photosensitive lyophilic/lyophobic base material 40. As a result, in the second test specimen, for example, it is considered that a region with large contact angle is formed in the second portion p2.

This phenomenon is particularly evident when, for example, a resin substrate that is transparent to visible light is used as the substrate 50s. For example, when a PEN film, or a PET film is used as the substrate 50s, this phenomenon is significantly produced. In a resin substrate (film), for example, scattering is easily produced in the base material itself. In a resin substrate, for example, unevenness is easily produced on the surface of the substrate. In a resin substrate, for example, unevenness is easily produced by cleaning (dry cleaning or wet cleaning or the like) prior to forming the film on the substrate. In a resin substrate, for example, sometimes fluorescent light is produced. In a resin substrate, for example, sometimes an oligomer is formed at the interface by a heating process. In these cases, the light scattering at the surface of the substrate is further increased. In a resin substrate, light (including, for example, scattered light) is easily transmitted through the substrate. In this way, light is also easily transmitted to the parts that were not exposed to light. From the above, it is considered that when a resin substrate is used, the amount of wetting and spreading of the liquid 60 is small.

In addition, in the second test specimen where the first layer 10 is not provided, when the refractive index of the second layer 20 is a specific value, optical matching can be produced at the interface between the substrate 50s and the second layer 20. In this case, the light can easily pass through this interface, and in some cases, the amount of scattered light increases at this interface.

In contrast, in the first test specimen, by providing the first layer 10, for example, the sensitivity of the photosensitive lyophilic/lyophobic base material 40 is substantially increased by the reflection at the interface I2 between the first layer 10 and the second layer 20. At the same time, for example, the scattered light from the substrate 50s is reduced. In this way, the contact angle on the second region r2 is kept low. In this way, the amount (length) of wetting and spreading is increased.

The wettability of the liquid 60 is sensitive to the surface conditions. If a region with low surface energy is formed on the first face 50a, the contact angle (advancing contact angle) is increased. Therefore, the wetting and spreading distance is shortened. By increasing the quantity of liquid 60 supplied, it is possible to form a continuous pattern. However, in some cases, the liquid 60 spreads and does not form the required plan shape, even when a large quantity of liquid 60 is supplied. For example, when conductor wiring is formed from the liquid 60, if a break occurs in the liquid 60, the wiring will be disconnected.

In the embodiment, the allowable range of manufacturing conditions can be extended. A good stable pattern can be formed on, for example, a plastic substrate. For example, if the photosensitive lyophilic/lyophobic base material 40 is photo-hardened, the reaction can easily occur even with weak light. In this case also, a high accuracy pattern can be formed by providing the combination of the first layer 10 and the second layer 20.

The following is a description of an example of test results for the amount (length) of wetting and spreading of the liquid 60. In this test, the first layer 10 and the second layer 20 are provided on the substrate 50s. In the test, the thickness of the first layer 10, the concentration of the light absorbing group, and, the material are varied. In this way, the attenuation rate with respect to light of the first layer 10 is varied. The attenuation rate with respect to the light L0 of the first layer 10 expressed in terms of the transmittance with respect to the light L0 of the first layer 10 corresponds to (1-transmittance). The attenuation rate may, for example, be obtained as follows. A reference test specimen that includes the substrate 50s and the second layer 20 is produced without providing the first layer 10. The intensity of the exposure light after the light L0 has passed through the reference test specimen is taken to be the reference intensity Ir. On the other hand, a measurement test specimen is produced that includes the first layer 10. The intensity of the exposure light after the same light L0 irradiates and passes through the measurement test specimen is taken to be the measurement intensity Im. The attenuation rate Rc is obtained from Rc=$\{(1-(Im/Ir)\} \times 100(\%)$. Note that in measuring the reference intensity Ir, a configuration in which there is no first layer 10 only is not strictly necessary. Provided the configuration is of layers with substantially large effect (for example, with a material in which the effect is large with only the substrate), then it does not matter.

In this test, an ultra high pressure mercury lamp is used as the light source of the exposure light. With the i-line as the center, short wavelength light and long wavelength light are removed with a filter. The removed light is used as the exposure light. The peak wavelength of the exposure light is about 365 nm.

For a plurality of test specimens in which the attenuation rate Rc was varied, a liquid drop is disposed on the point of intersection r20 of the "T-shaped" second region r2. The liquid 60 is tetradecane solution Ag nano ink. In the test, the single drop of the liquid is disposed at the point of intersection r20 by the inkjet method. The volume of the drop of liquid is 1 picoliter.

As shown in FIG. 2, when the drop of liquid has wet and spread, the length along the X-axis direction of the liquid 60 is taken to be the spreading length Ls.

Figure 3:
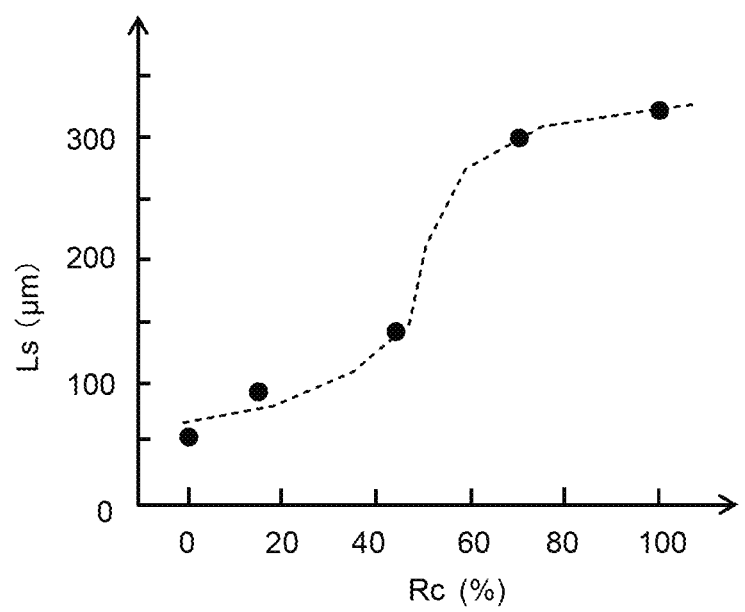
FIG. 3 is a graph showing the characteristics of the pattern.

FIG. 3 is a graph illustrating the characteristics of the pattern.

The horizontal axis of FIG. 3 is the attenuation rate Rc (%). The vertical axis is the spreading length Ls (μm).

As can be seen from FIG. 3, the higher the attenuation rate Rc, the longer the spreading length Ls. For example, preferably the attenuation rate Rc is not lower than 30%. In this way, the effect of enlarging the spreading length Ls can be obtained. More preferably, the attenuation rate Rc is not lower than 50%. In this way, the effect of further enlarging the spreading length Ls can be obtained. Still more preferably, the attenuation rate Rc is not lower than 70%. In this way, the spreading length Ls is sufficiently enlarged. For example, preferably, the transmittance of the first layer 10 is less than 70%. More preferably, the transmittance of the first layer 10 is less than 50%. Preferably, the transmittance of the first layer 10 is less than 30%.

A long spreading length means that the contact angle of the liquid 60 with respect to the second region r2 is small. In this way, it is possible to increase the pitch of the drops of the liquid 60 and the liquid 60 will be linked without being disconnected. For example, when forming wiring with conductive ink, breakage of the wiring is eliminated and the yield is improved. When, for example, the pattern of dropping the liquid drops is a T-shape, by dropping onto the branch portion only, the liquid can spread to the wiring section. Conversely, by dropping only onto the wiring section, the liquid can spread to the branch portion also. By simplifying the dropping pattern, the time for inkjet drawing is shortened, and the tact time can be improved. When connecting positions where the wiring is narrow (for example, not greater than 10 μm) and positions where the wiring is wide (for example, not less than 20 μm) are connected, by dropping at the positions where the wiring is wide only, the ink (liquid 60) can spread to the positions where the wiring is narrow. A fine pattern can be formed regardless of the liquid drop size.

In the embodiment, in the first layer 10, for example, preferably, the attenuation rate Rc with respect to light of wavelength not longer than 390 nm is not lower than 10%. In the embodiment, in the first layer 10, for example, preferably, the attenuation rate Rc with respect to the light of wavelength not longer than 370 nm is not lower than 50%.

In the embodiment, the attenuation rate Rc corresponds to the ratio of the intensity of the light that has passed through a test specimen in which the substrate 50s, the first layer 10, and the second layer 20 are provided, and the intensity of the light that has passed through a test specimen in which the substrate 50s and the second layer 20 are provided. In the embodiment, when the plastic substrate is used, there is an effect such as scattering and the like in the plastic substrate. For example, with a glass substrate or the like, the scattering and the like is small. The attenuation rate Rc when a glass substrate or the like is used as the substrate 50s tends to be higher than the attenuation rate Rc when the plastic substrate is used as the substrate 50s.

In the embodiment, the substrate 50s includes, for example, glass. The substrate 50s may include, for example, a plastic film. The thickness of the substrate 50s is, for example, not less than 2 μm and not greater than 300 μm.

In the embodiment, for example the first layer 10 attenuates the light L0 used when forming the pattern. The first layer 10 absorbs at least a portion of the light L0. The first layer 10 may also reflect a portion of the light L0.

The light L0 includes, for example, ultraviolet light (ultraviolet rays). In this way, the reactivity of the light can be increased.

The first layer 10 includes, for example, an organic material. The organic material includes, for example, a polymer chain. The polymer chain includes, for example, a functional group. The functional group has, for example, ultraviolet absorbing properties. By providing the polymer chain including the functional group, for example, elution of the functional part is suppressed. Transformation does not easily occur. For example, the transmittance of the first layer 10 with respect to visible light is higher than the transmittance of the first layer 10 with respect to ultraviolet light. The first layer 10 may include, for example, fine metal particulates or the like.

For example, the first layer 10 includes acrylic resin. The acrylic resin includes an ultraviolet absorbing group. The thickness of the first layer 10 is, for example, not less than 2 μm and not greater than 20 μm.

The first layer 10 may include a polyimide resin. For example, ultraviolet absorbing characteristics are set as appropriate in the polyimide resin. In this way, in the first layer 10, an appropriate attenuation rate Rc can be obtained. The first layer 10 may include, for example, a transparent polyimide. In the transparent polyimide, the transmittance of the visible light region is high. The first layer 10 may include, for example, a semi-alicyclic polyimide. The first layer 10 may include, for example, a wholly alicyclic polyimide. The first layer 10 may include a sulfur-containing polyimide. These polyimides absorb light of wavelength 370 nm and shorter.

In the embodiment, the second layer 20 may include, for example, at least either of polystyrene resin and acrylic resin. These resins are, for example, lyophilic. When the second layer 20 is lyophilic, the second layer 20 includes substantially no lyophobic groups such as fluorine or the like. When the second layer 20 is lyophilic, the second layer 20 includes lyophilic groups.

The liquid 60 may include, for example, tetradecane solvent. The liquid 60 may include, for example, tetradecane solvent and Ag nano ink. In this case, preferably, the contact angle of the tetradecane with the second layer 20 is small.

The second layer 20 may include, for example, an organic-inorganic hybrid material. The second layer 20 may include, for example, a coated inorganic hybrid material.

In the embodiment, the photosensitive lyophilic/lyophobic base material 40 is provided on the second layer 20. The layer 40a formed from the photosensitive lyophilic/lyophobic base material 40 is, for example, lyophobic. For example, a photosensitive material that includes a lyophobic group is used as the material of the photosensitive lyophilic/lyophobic base material 40. By irradiating this material with light, the layer 40a formed from the lyophobic photosensitive lyophilic/lyophobic base material 40 is obtained. The lyophobic group includes at least any one of a group that includes fluorine, a long chain alkyl group, a phenol group, and a silicone group.

For example, a lyophobic film that includes a group that includes fluorine can be obtained from the material of the photosensitive lyophilic/lyophobic base material 40. The lyophobic film is formed by hardening by irradiating with light of wavelength 365 nm. The material of the photosensitive lyophilic/lyophobic base material 40 is a photo-hardening material. High-sensitivity can be obtained from photo-hardening materials. The photo-hardened film obtained from photo-hardening material is lyophobic, and an optical system corresponding to a wavelength of, for example, 365 nm can be used. Using this optical system, a high sensitivity lyophobic film can be obtained.

The lyophobic layer 40a is obtained from the material of the photosensitive lyophilic/lyophobic base material 40. For forming the shape of the lyophobic layer 40a, for example, a direct writing light exposure device with a spatial modulator can be used. For example, a digital micromirror device (DMD) can be used as the spatial modulator. For example, 365 nm light can be used for the exposure light. An ultra high pressure mercury lamp or an ultra violet LED can be used as the light source. An optical filter can be used to obtain light of only the required wavelength. Depending on the application, light with a plurality of wavelength peaks may be used. For example, in the direct writing light exposure device, the deformation of the substrate 50s may be detected, and the light exposure data may be corrected in accordance with the deformation. In this way, high alignment accuracy can be obtained even when there is a possibility that the pattern position has shifted from the design position.

In the embodiment, the portion of the material of the photosensitive lyophilic/lyophobic base material 40 that is not exposed to light is, for example, removed. For example, at least either of cleaning with a solvent or heating can be used for the removing. The first region r1 and the second region r2 are obtained as a result of the removing (see FIG. 1E).

In the embodiment, the liquid 60 may include, for example, a solvent other than tetradecane solvent. The liquid 60 may include a mixed solvent.

The liquid 60 may be conductive ink. In this case, the liquid 60 may include at least either of, for example, a dispersing liquid, sol-gel, and a complexing liquid. The liquid 60 may include at least any one of metallic particulates, CNT, and fullerenes. The metallic particulates may include, for example, metal nano particulates. The metallic particulates include, for example, at least any of Ag, Au, Cu, and the like.

The liquid 60 includes, for example, a solvent. The solvent includes, for example, at least either water or an organic solvent. The organic solvent includes, for example, at least any one of water, alcohol, tetradecane, propylene glycol methyl ether acetate (PGMEA), toluene, mesitylene, and tetralin. The organic solvent may include a liquid mixture of these materials.

The liquid 60 may include, for example, metal. The liquid 60 may include a conductive material. The liquid 60 may include at least any one of polymer organic semiconductor, low molecular weight organic semiconductor, inorganic semiconductor, organic resin, and inorganic insulator. The liquid 60 may include a dispersion of these materials. A solution can be used as the liquid 60. This solution includes a solvent and the above materials dissolved in the solvent. The liquid 60 may include, for example, an agglomeration reduction agent, a drying reduction agent, a surfactant, or the like.

The second region r2 and the liquid 60 are brought into contact. The contact is carried out using, for example, printing. At least any one of, for example, coating printing, capillary printing, and dip coating may be used as the printing. The liquid 60 may also contact at least a portion of the first region r1. For example, the liquid 60 may be coated over the whole surface of the upper surface 50u of the processed body 50. Contacting methods may include the inkjet method, the micro dispensing method, and the like. In this case, the liquid 60 may, for example, be selectively brought into contact with either of the two regions.

In the embodiment, a surface treatment may be carried out on the upper surface 50u of the processed body 50, between the process of FIG. 1E (forming the first region r1 and the second region r2) and the process of FIG. 1F (bringing the liquid 60 into contact with the second region r2). The surface treatment may include, for example, a UV/O$_3$ treatment. The surface treatment may include, for example, an ultraviolet irradiation treatment. The surface treatment may include, for example, an ozone treatment. The surface treatment may include, for example, a plasma treatment. As a result of these treatments, for example, the contact angle with the second region r2 can be stabilized and reduced. For example, if an aqueous solution is used as the liquid 60, the difference between the contact angles in the second region r2 and the first region r1 can be increased by the above surface treatments. The difference in contact angles in these regions can be made uniform within the surface.

In the embodiment, preferably, for example, the first layer 10 has low light scattering properties. For example, if the first layer 10 is thin, the light scattering properties can be reduced.

In the embodiment, the thickness of the first layer 10 is, for example, not less than 2 μm and not greater than 5 μm. In the embodiment, the thickness of the first layer 10 may be, for example, not less than 5 μm and not greater than 30 μm. In the first layer 10, the thickness of the first layer 10 may be determined from the light absorbing performance of light absorbing components and the concentration of the light absorbing components. In the first layer 10, the required attenuation rate Rc can be obtained.

In the first layer 10, for example, an ultraviolet absorbing group may be provided in a polymer resin skeleton. In this case, for example, a material with low light scattering properties is used as the polymer resin. In this case, the first layer 10 can be made thicker while maintaining low scattering properties.

The following are descriptions of second to fourth methods, as other examples of the method according to the embodiment.

FIG. 4A to FIG. 4G are schematic cross-sectional views of a processing procedure illustrating another pattern forming method according to the first embodiment.

Figure 4A:
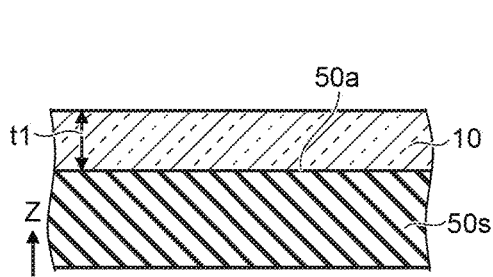
FIG. 4A to FIG. 4G are schematic cross-sectional views of a processing procedure showing another pattern forming method according to the first embodiment.
Figure 4B:
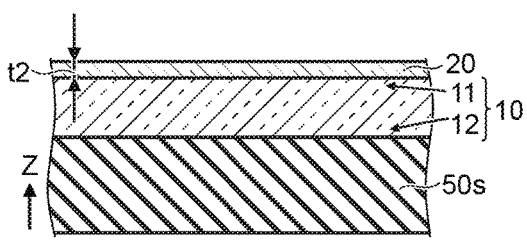
Figure 4C:
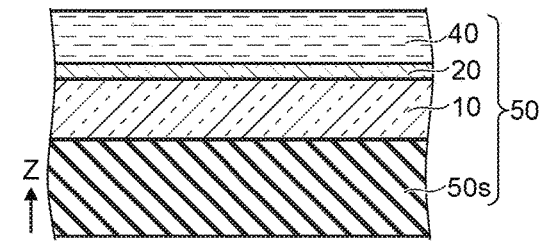

These drawings illustrate a second method PR2 of a pattern forming method according to the embodiment. The processed body 50 is prepared as shown in FIG. 4A to FIG. 4C. The processed body 50 includes the substrate 50s having the first face 50a, the first layer 10 provided on the first face 50a, the second layer 20 provided on the first layer 10, and the photosensitive lyophilic/lyophobic base material 40 provided on the second layer 20. The pattern forming method according to the embodiment may also include forming of the processed body 50.

Figure 4D:
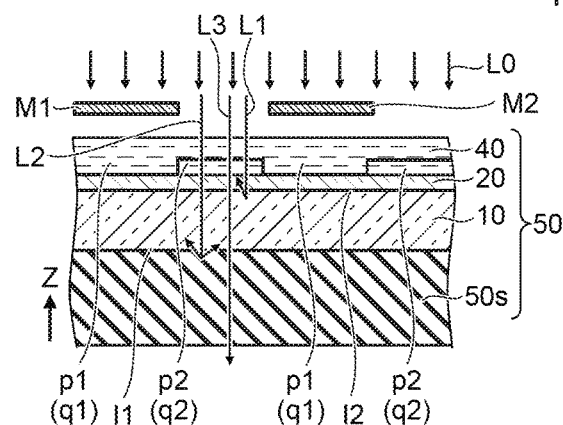

As shown in FIG. 4D, one of the first portion p1 and the second portion p2 of the photosensitive lyophilic/lyophobic base material 40 is irradiated with the light L0. In the second method PR2, the light L0 is irradiated onto the second portion p2. In this example also, the photosensitive lyophilic/lyophobic base material 40 is a negative type. For example, the first portion p1 is removed. This removal is carried out by, for example, at least any one of treatment with a solvent, heating, and reduction in pressure.

Figure 4E:
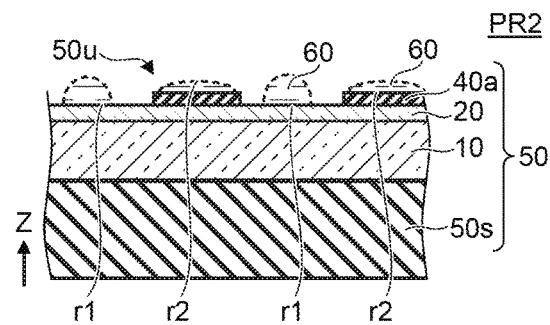

As shown in FIG. 4E, the layer 40a formed from the photosensitive lyophilic/lyophobic base material 40 remains. In this example, the second portion p2 which is a layer formed on a portion of the second layer 20 remains. In the region where the first portion p1 has been removed, the surface of the second layer 20 is exposed. In the second method PR2, the contact angle of the liquid 60 on the second portion p2 is smaller than the contact angle of the liquid 60 on the surface of the second layer 20. In FIG. 4E, the shape of the liquid 60 illustrates the relationship of the contact angles.

In the second method PR2, the first region r1 of the upper surface 50u of the processed body 50 corresponds to the surface of the second layer 20 that is exposed when the first portion p1 is removed. The second region r2 corresponds to the surface of the second portion p2.

In this way, the first contact angle of the liquid 60 on the first region r1 of the upper surface 50u of the processed body 50 is made relatively larger than the second contact angle of the liquid 60 on the second region r2 of the upper surface 50u. The first region r1 overlaps the first position q1 of the first portion p1 in the Z-axis direction. The second region r2 overlaps the second position q2 of the second portion p2 in the first direction.

Figure 4F:
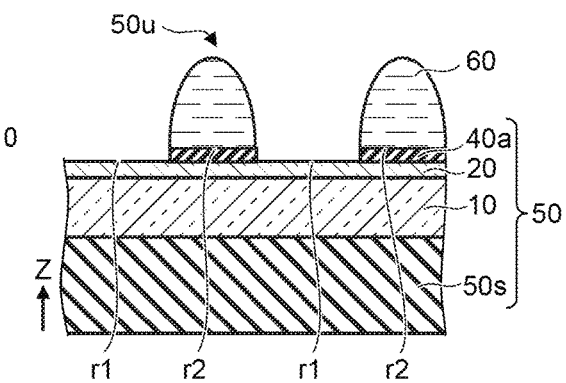

As shown in FIG. 4F, the first pattern PT1 is formed by bringing the liquid 60 into contact with the second region r2. The liquid 60 may also temporarily contact at least a portion of the first region r1. In this example, the liquid 60 is not substantially provided on the first region r1 (surface of the second layer 20 that is exposed after removing the first portion p1) which has a relatively large contact angle. The liquid 60 is provided on the second region r2 (surface of the first portion p1) which has a relatively small contact angle. The first pattern PT1 is formed as a result of this difference. In this example also, the first pattern PT1 includes at least a portion of the first region r1 and the liquid 60 on at least a portion of the second region r2.

Figure 4G:
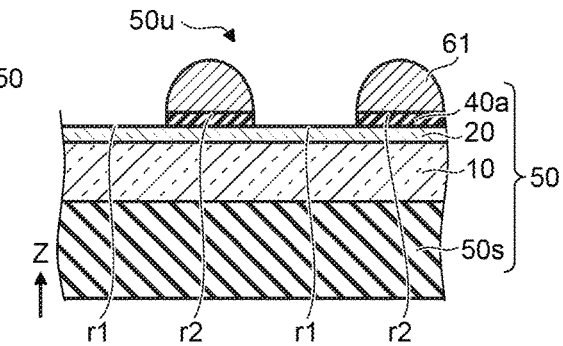

As shown in FIG. 4G, the solid 61 is formed from at least a portion of the liquid 60 on at least a portion of the second region r2. In this way, the second pattern PT2 that includes the solid 61 is formed.

In the second method PR2, the light L0 is irradiated onto the second portion p2. The first process may include hardening at least a portion of the second portion p2. The first process may further include removing at least a portion of the first portion p1 after irradiation.

In the second method PR2, for example, a portion of the first light L1 that is reflected at the interface 12 between the second layer 20 and the first layer 10 is incident on the second portion p2. The reaction of the second portion p2 is promoted based on the light, and the sensitivity of the photosensitive lyophilic/lyophobic base material 40 is substantially increased. For example, high accuracy can be obtained in the first pattern PT1 that includes the first region r1 and the second region r2. For example, high accuracy can be obtained in the second pattern PT2.

In the second method PR2, for example, the first layer 10 has attenuation properties with respect to the light L0. For example, as a result of the scattered and other light of the light L0, for example in some cases, a very small amount of the lyophilic layer may remain on the surface that should become a lyophobic surface. In this case, the contact angle is reduced, and the liquid 60 remains on the lyophobic surface side. In the second method PR2, for example, the remaining liquid 60 is suppressed by the attenuating properties. As a result, the accuracy of the pattern is improved.

For example, the first attenuation rate of the first layer 10 with respect to the light L0 may be higher than the second attenuation rate of the second layer 20 with respect to the light L0. For example, the input of the second light L2 that is reflected at the interface I1 into regions where it is not necessary is suppressed. For example, the accuracy of the pattern is improved.

For example, the first absorption rate of the first layer 10 with respect to the light L0 is higher than the second absorption rate of the second layer 20 with respect to the light L0. The remaining liquid 60 is suppressed.

In the second method PR2 also, for example, the second thickness t2 of the second layer 20 is less than the first thickness t1 of the first layer 10. For example, the incidence of the reflected and inclined first light L1 onto the second portion p2 is suppressed. The accuracy of the pattern is further improved.

FIG. 5A to FIG. 5G are schematic cross-sectional views of a processing procedure illustrating another pattern forming method according to the first embodiment.

Figure 5A:
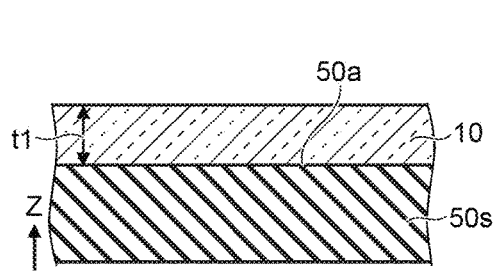
FIG. 5A to FIG. 5G are schematic cross-sectional views of a processing procedure showing another pattern forming method according to the first embodiment.

These drawings illustrate a third method PR3 of a pattern forming method according to the embodiment. The processed body 50 is prepared as illustrated in FIG. 5A to FIG. 5C. The processed body 50 includes the substrate 50s having the first face 50a, the first layer 10 provided on the first face 50a, the second layer 20 provided on the first layer 10, and the photosensitive lyophilic/lyophobic base material 40 provided on the second layer 20. The processed body 50 may also be formed.

Figure 5E:
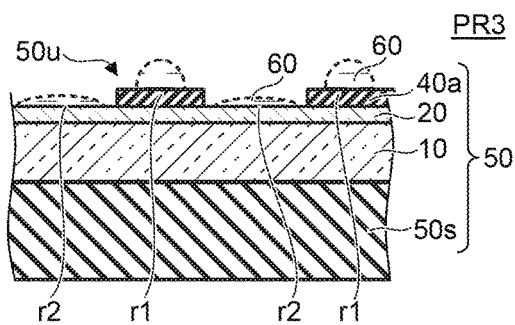
Figure 5B:
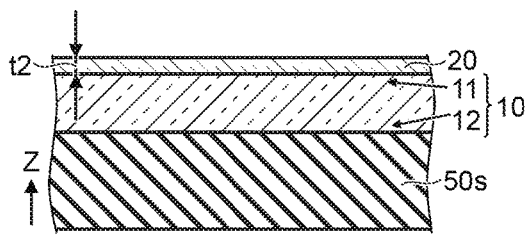
Figure 5F:
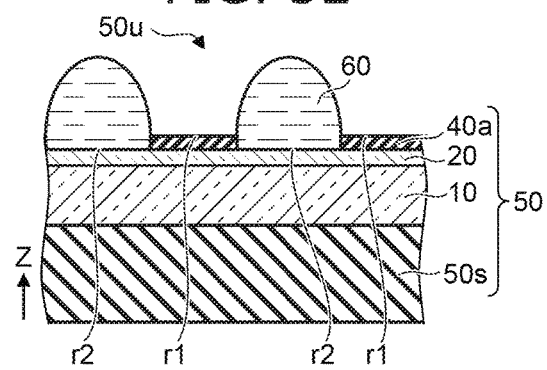
Figure 5C:
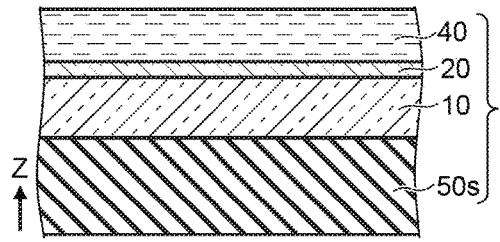
Figure 5G:
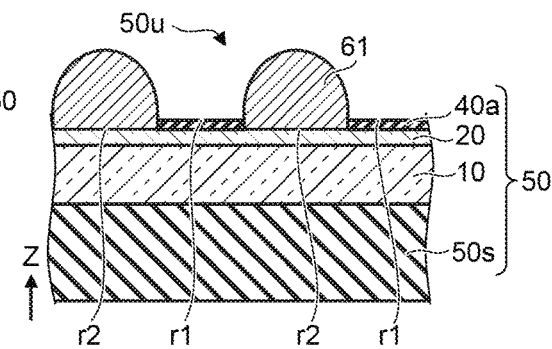
Figure 5D:
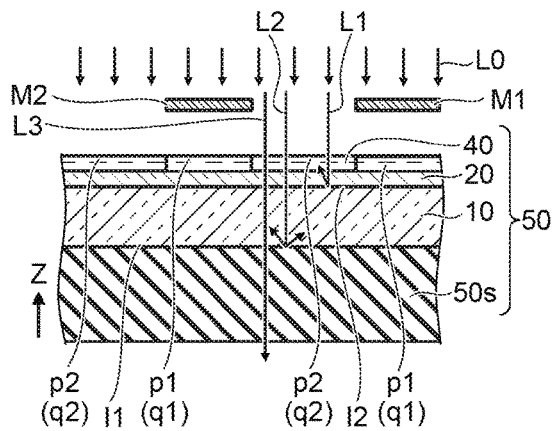

As shown in FIG. 5D, one of the first portion p1 and the second portion p2 of the photosensitive lyophilic/lyophobic base material 40 is irradiated with the light L0. In the third method PR3, the light L0 is irradiated onto the second portion p2. In this example, the photosensitive lyophilic/lyophobic base material 40 is a positive type. For example, the second portion p2 is removed. This removal is carried out by, for example, at least any one of treatment with a solvent, heating, and reduction in pressure.

As shown in FIG. 5E, the layer 40a formed from the photosensitive lyophilic/lyophobic base material 40 remains. In this example, the first portion p1 remains on a portion of the second layer 20. In the region where the second portion p2 has been removed, the surface of the second layer 20 is exposed. A heating process or the like may also be carried out. As a result of the heating process, for example, the layer 40a becomes strong. For example, hardening is carried out by the heating process. In the third method PR3, the contact angle of the liquid 60 on the first portion p1 is larger than the contact angle of the liquid 60 on the surface of the second layer 20. In FIG. 5E, the shape of the liquid 60 illustrates the relationship of the contact angles.

In the third method PR3, the first region r1 of the upper surface 50u of the processed body 50 corresponds to the surface of the first portion p1. The second region r2 corresponds to the surface of the second layer 20 that is exposed when the second portion p2 is removed.

In this way, the first contact angle of the liquid 60 on the first region r1 of the upper surface 50u of the processed body 50 is made relatively larger than the second contact angle of the liquid 60 on the second region r2 of the upper surface 50u. The first region r1 overlaps the first position q1 of the first portion p1 in the Z-axis direction. The second region r2 overlaps the second position q2 of the second portion p2 in the first direction.

As shown in FIG. 5F, the first pattern PT1 is formed by bringing the liquid 60 into contact with the second region r2. The liquid 60 may also temporarily contact at least a portion of the first region r1. In this example, the liquid 60 is not substantially provided on the first region r1 (surface of the first portion p1) which has a relatively large contact angle. The liquid 60 is provided on the second region r2 (surface of the second layer 20 that is exposed when the second portion p2 is removed) which has a relatively small contact angle. The first pattern PT1 is formed as a result of this difference. In this example also, the first pattern PT1 includes at least a portion of the first region r1 and the liquid 60 on at least a portion of the second region r2.

As shown in FIG. 5G, the solid 61 is formed from at least a portion of the liquid 60 on at least a portion of the second region r2. In this way, the second pattern PT2 that includes the solid 61 is formed.

In the third method PR3, the light L0 is irradiated onto the second portion p2. The first process may include hardening at least a portion of the first portion p1. The first process may further include removing at least a portion of the second portion p2 after irradiation.

In the third method PR3, for example, a portion of the first light L1 that is reflected at the interface I2 between the second layer 20 and the first layer 10 is incident on the second portion p2. The reaction of the second portion p2 is promoted based on the light, and the sensitivity of the photosensitive lyophilic/lyophobic base material 40 is substantially increased. For example, high accuracy can be obtained in the first pattern PT1 that includes the first region r1 and the second region r2. For example, high accuracy can be obtained in the second pattern PT2.

In the third method PR3, for example, the first layer 10 has attenuation properties with respect to the light L0. As a result, the incidence of the second light L2 onto regions where it is not necessary due to scattered and other light is suppressed. In this way, the accuracy of the pattern is improved.

In the third method PR3, for example, a first absorption and attenuation rate of the first layer 10 with respect to the light L0 may be higher than a second absorption and attenuation rate of the second layer 20 with respect to the light L0. For example, the input of the second light L2 that is reflected at the interface I1 into regions where it is not necessary is suppressed. The accuracy of the pattern is further improved.

In the third method PR3, for example, the first absorption rate of the first layer 10 with respect to the light L0 is higher than the second absorption rate of the second layer 20 with respect to the light L0. For example, the input of the second light L2 that is reflected at the interface I1 into regions where it is not necessary is suppressed. The accuracy of the pattern is further improved.

In the third method PR3 also, for example, the second thickness t2 of the second layer 20 is less than the first thickness t1 of the first layer 10. For example, the incidence of the reflected and inclined first light L1 onto the second portion p2 is suppressed. The accuracy of the pattern is further improved.

FIG. 6A to FIG. 6G are schematic cross-sectional views of a processing procedure illustrating another pattern forming method according to the first embodiment.

Figure 6A:
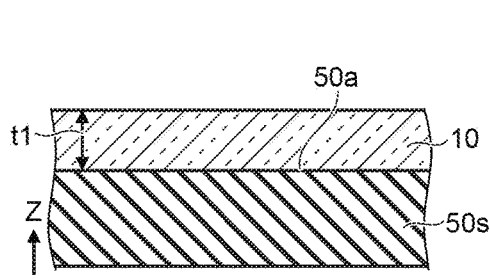
FIG. 6A to FIG. 6G are schematic cross-sectional views of a processing procedure showing another pattern forming method according to the first embodiment.
Figure 6B:
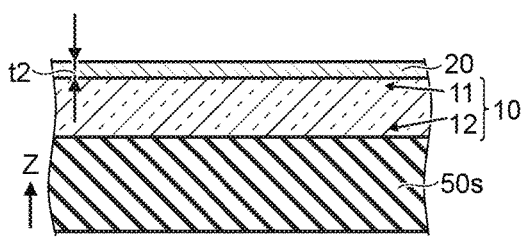
Figure 6C:
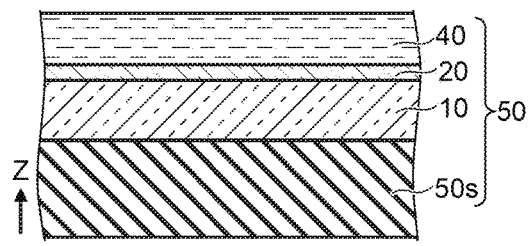

These drawings illustrate a fourth method PR4 of a pattern forming method according to the embodiment. The processed body 50 is prepared as illustrated in FIG. 6A to FIG. 6C. The processed body 50 includes the substrate 50s having the first face 50a, the first layer 10 provided on the first face 50a, the second layer 20 provided on the first layer 10, and the photosensitive lyophilic/lyophobic base material 40 provided on the second layer 20. The processed body 50 may also be formed.

Figure 6D:
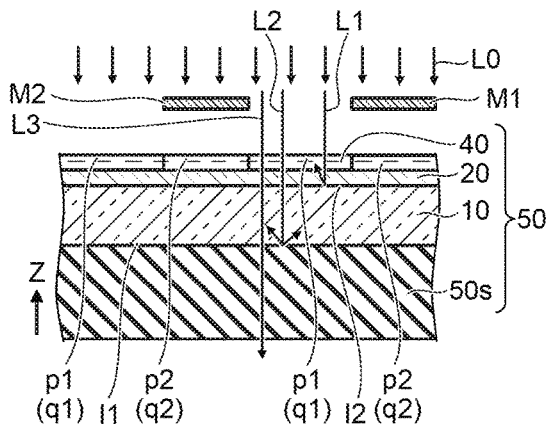

As shown in FIG. 6D, one of the first portion p1 and the second portion p2 of the photosensitive lyophilic/lyophobic base material 40 is irradiated with the light L0. In the fourth method PR4, the light L0 is irradiated onto the first portion p1. In this example, the photosensitive lyophilic/lyophobic base material 40 is a positive type. For example, the first portion p1 is removed. This removal is carried out by, for example, at least any one of treatment with a solvent, heating, and reduction in pressure.

Figure 6E:
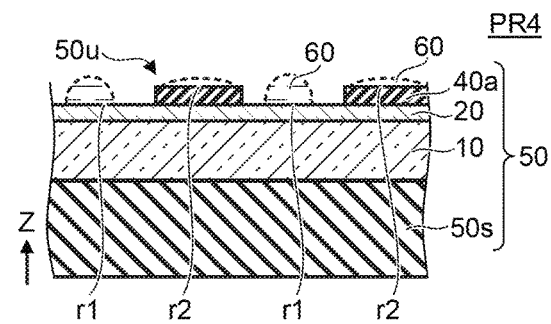

As shown in FIG. 6E, the layer 40a formed from the photosensitive lyophilic/lyophobic base material 40 remains. In this example, the second portion p2 remains on a portion of the second layer 20. In the region where the first portion p1 has been removed, the surface of the second layer 20 is exposed. A heating process or the like may also be carried out. As a result of the heating process, for example, the layer 40a becomes strong. For example, hardening is carried out by the heating process. In the fourth method PR4, the contact angle of the liquid 60 on the second portion p2 is smaller than the contact angle of the liquid 60 on the surface of the second layer 20. In FIG. 6E, the shape of the liquid 60 illustrates the relationship of the contact angles.

In the fourth method PR4, the first region r1 of the upper surface 50u of the processed body 50 corresponds to the surface of the second portion p2. The second region r2 corresponds to the surface of the second layer 20 that is exposed when the first portion p1 is removed.

In this way, the first contact angle of the liquid 60 on the first region r1 of the upper surface 50u of the processed body 50 is made relatively larger than the second contact angle of the liquid 60 on the second region r2 of the upper surface 50u. The first region r1 overlaps the first position q1 of the first portion p1 in the Z-axis direction. The second region r2 overlaps the second position q2 of the second portion p2 in the first direction.

Figure 6F:
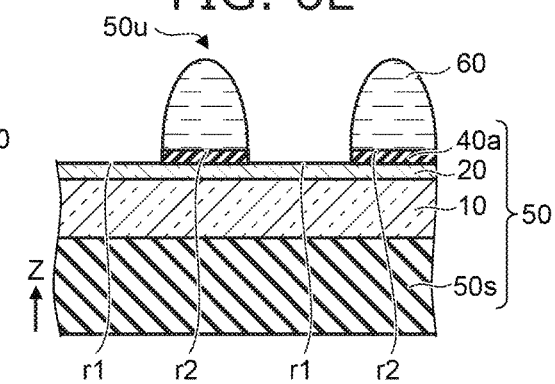

As shown in FIG. 6F, the first pattern PT1 is formed by bringing the liquid 60 into contact with the second region r2. The liquid 60 may also temporarily contact at least a portion of the first region r1. In this example, the liquid 60 is not substantially provided on the first region r1 (surface of the second layer 20 that is exposed after removing the first portion p1) which has a relatively large contact angle. The liquid 60 is provided on the second region r2 (surface of the second portion p2) which has a relatively small contact angle. The first pattern PT1 is formed as a result of this difference. In this example also, the first pattern PT1 includes at least a portion of the first region r1 and the liquid 60 on at least a portion of the second region r2.

Figure 6G:
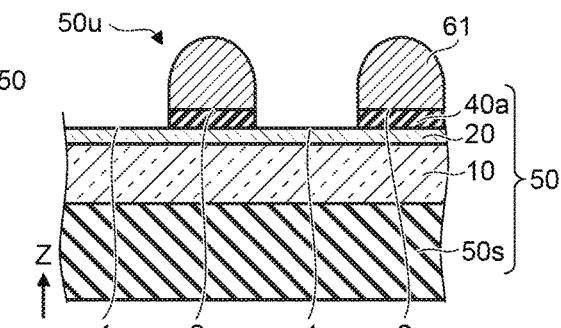

As shown in FIG. 6G, the solid 61 is formed from at least a portion of the liquid 60 on at least a portion of the second region r2. In this way, the second pattern PT2 that includes the solid 61 is formed.

In the fourth method PR4, the light L0 is irradiated onto the first portion p1. The first process may include hardening at least a portion of the second portion p2. The first process may further include removing at least a portion of the first portion p1 after irradiation.

In the fourth method PR4, for example, a portion of the first light L1 that is reflected at the interface I2 between the second layer 20 and the first layer 10 is incident on the first portion p1. The reaction of the first portion p1 is promoted based on the light, and the sensitivity of the photosensitive lyophilic/lyophobic base material 40 is substantially increased. For example, high accuracy can be obtained in the first pattern PT1 that includes the first region r1 and the second region r2. For example, high accuracy can be obtained in the second pattern PT2.

In the fourth method PR4, for example, the first layer 10 has attenuation properties with respect to the light L0. As a result the incidence of the second light L2 onto regions where it is not necessary due to scattered and other light is suppressed. In this way, the accuracy of the pattern is further improved.

In the fourth method PR4, for example, the first attenuation rate of the first layer 10 with respect to the light L0 may be higher than the second attenuation rate of the second layer 20 with respect to the light L0. For example, the input of the second light L2 that is reflected at the interface I1 into regions where it is not necessary is suppressed. The accuracy of the pattern is further improved.

In the fourth method PR4, for example, the first absorption rate of the first layer 10 with respect to the light L0 is higher than the second absorption rate of the second layer 20 with respect to the light L0. For example, the input of the second light L2 that is reflected at the interface I1 into regions where it is not necessary is suppressed. The accuracy of the pattern is further improved.

In the fourth method PR4 also, for example, the second thickness t2 of the second layer 20 is less than the first thickness t1 of the first layer 10. For example, the incidence of the reflected and inclined first light L1 onto the second portion p2 is suppressed. The accuracy of the pattern is further improved.

In the first to fourth methods PR1 to PR4 as described above, the first process may include modifying at least a portion of one of the first portion p1 and the second portion (the portion that is irradiated with the light L0). The contact angle is changed by the modification due to the irradiation with the light L0.

Figures 7A, 7B:
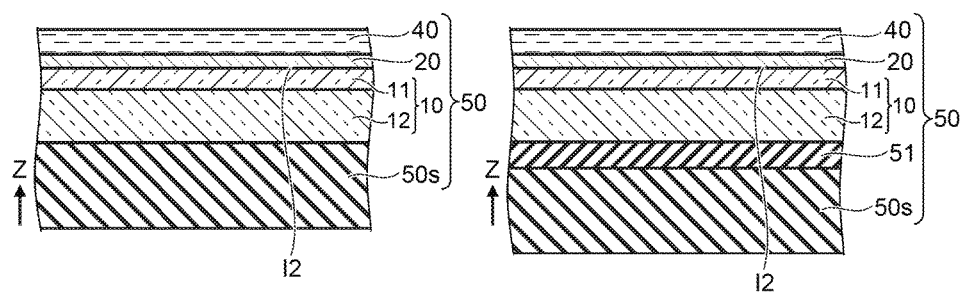
FIG. 7A and FIG. 7B are schematic cross-sectional views showing another pattern forming method according to the first embodiment.

FIG. 7A and FIG. 7B are schematic cross-sectional views illustrating another pattern forming method according to the first embodiment.

These drawings illustrate the state of the processed body 50 in the processes of, for example, FIG. 1C, FIG. 4C, FIG. 5C, and FIG. 6C.

As shown in FIG. 7A, in this example, the first layer 10 include the upper region 11 and the substrate side region 12. The upper region 11 is in contact with the second layer 20. The substrate side region 12 is provided between the upper region 11 and the substrate 50s. In this example, the material of the upper region 11 is different from the material of the substrate side region 12. In this example also, the first refractive index of the upper region 11 is different from the second refractive index of the second layer 20. By making the refractive indices different in the upper region 11 and the second layer 20, the light L0 is effectively reflected at the interface I2 between the upper region 11 and the second layer 20.

On the other hand, the material of the substrate side region 12 can be selected without consideration of the refractive index of the second layer 20. For example, the material of the substrate side region 12 can be selected from the point of view of the light absorption rate. For example, the attenuation rate Rc of the first layer 10 can be further increased. For example, the material of the substrate side region 12 can be selected from the point of view of flatness. For example, by improving the flatness, the flatness of the surface of the upper region 11 can be improved. Light is effectively reflected at the interface I2 between the upper region 11 and the second layer 20.

The configuration in which the materials of the upper region 11 and the substrate side region 12 are changed may also be applied to any one of the first to fourth methods PR1 to PR4.

In the embodiment, a region with a still different material may be provided between the upper region 11 and the substrate side region 12. The upper region 11 may be, for example, an overcoat layer.

The refractive index of the substrate side region 12 may be different from the first refractive index of the upper region 11. At least a portion of the light L0 may be reflected at the interface between the substrate side region 12 and the upper region 11. As a result of this reflection, for example, the quantity of the light L0 arriving at the substrate 50s can be suppressed. For example, it is possible to suppress scattering and the like in the substrate 50s, and suppress the unintentional incidence of light onto other regions. There is a clear difference between the first region r1 and the second region r2. The interface between these regions is also clear.

As shown in FIG. 7B, a first intermediate layer 51 may be further provided. The first intermediate layer 51 is provided between the substrate 50s and the first layer 10. The first intermediate layer 51 is, for example, an undercoat layer. The first intermediate layer 51 may be provided between at least a portion of the substrate 50s and at least a portion of the first layer 10. The first intermediate layer 51 may, for example, include a conductive material. The first intermediate layer 51 may, for example, include a semiconductor material. The first intermediate layer 51 may, for example, include an insulating material.

FIG. 8A to FIG. 8D are schematic cross-sectional views of a processing procedure illustrating another pattern forming method according to the first embodiment.

For example, a thin film transistor can be manufactured by the method illustrated in these drawings.

Figure 8A:
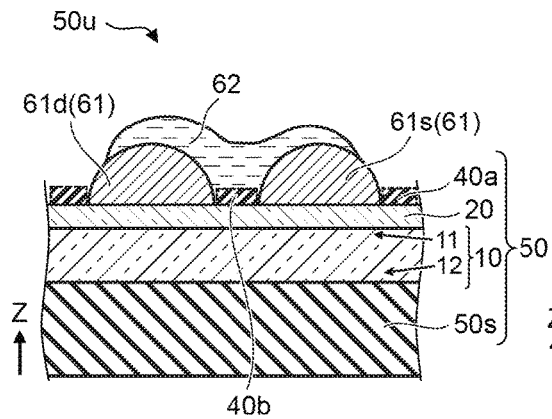
FIG. 8A to FIG. 8D are schematic cross-sectional views of a processing procedure showing another pattern forming method according to the first embodiment.

As shown in FIG. 8A, the first layer 10, the second layer 20, and the layer 40a and a layer 40b formed from the photosensitive lyophilic/lyophobic base material 40 are provided on the substrate 50s. The substrate 50s is a PEN film. The substrate 50s may be a PET film. In this example, the contact angle of the liquid 60 on the layers 40a and 40b formed from the photosensitive lyophilic/lyophobic base material 40 is larger than the contact angle of the liquid 60 on the surface of the second layer 20. The liquid 60 is, for example, printed on the upper surface 50u of the processed body 50. For example, coating printing is carried out. In the coating printing, the liquid 60 is retained and moved between the processed body 50 and a capillary head, and between the processed body 50 and an applicator or the like, so that the liquid 60 is moved on the surface of the processed body 50. Inkjet printing may also be used. The liquid 60 is, for example, Ag nano ink. The solid 61 is formed by baking. One region of the solid 61 is a source electrode 61s. Another region of the solid 61 is a drain electrode 61d.

The first layer 10 has the characteristic that it attenuates light during light exposure. In this way, scattered and other light is suppressed, and the contact angle on the lyophilic surface is maintained low. In this way, for example, the source electrode 61s and the drain electrode 61d can be formed finely and with high accuracy.

Then, surface treatment is carried out on the layers 40a and 40b that are formed from the photosensitive lyophilic/lyophobic base material 40 between the source electrode 61s and the drain electrode 61d. As a result of the surface treatment, the wettability of the layers 40a and 40b is improved. If the surface treatment is carried out at once, the wettability of the layers 40a and 40b is improved. The surface treatment may also be carried out partially. A liquid that will become a semiconductor layer 62 is coated onto the source electrode 61s, the drain electrode 61d, and the layer 40b. The coating is carried out, for example, by the inkjet method. A solid is formed from this liquid, and this solid becomes the semiconductor layer 62. The semiconductor layer 62 is, for example, an organic semiconductor layer.

The semiconductor layer 62 may, for example, include a polymer organic semiconductor. The semiconductor layer 62 may, for example, include a low molecular weight organic semiconductor. The semiconductor layer 62 may, for example, include a polymer organic semiconductor and a low molecular weight organic semiconductor. The semiconductor layer 62 may be, for example, an inorganic semiconductor.

In the above, prior to forming the semiconductor layer 62, a self-assembled monolayer (SAM) may be formed on the surface of the source electrode 61s and the drain electrode 61d. For example, as a result of this SAM, the work functions are matched between these electrodes and the semiconductor layer 62. In this way, for example, low contact resistance can be obtained.

Figure 8B:
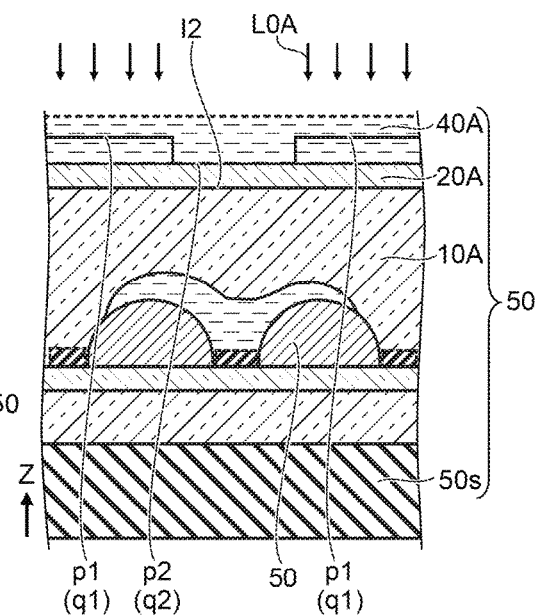

As shown in FIG. 8B, another first layer 10A is formed. The other first layer 10A forms at least a portion of, for example, a gate insulating layer. In forming the other first layer 10A, substantially no damage is caused to the semiconductor layer 62. For example, a polystyrene thermosetting material can be used as the material of the other first layer 10A. The other first layer 10A may be, for example, a single layer, or it may be a multiple layer.

Another second layer 20A is formed on the other first layer 10A. The other second layer 20A is an insulating layer. The other second layer 20A may become a portion of a gate insulating layer. The other second layer 20A is formed, for example, by coating. The other second layer 20A is, for example, lyophilic with respect to conductive ink that is applied later.

Another photosensitive lyophilic/lyophobic base material 40A is formed on the other second layer 20A. For example, coating and drying is carried out in this forming. Then, a portion of the other photosensitive lyophilic/lyophobic base material 40A is irradiated with light L0A. In other words, light exposure is carried out. As a result of the light exposure, a layer 40Aa formed from the other photosensitive lyophilic/lyophobic base material 40A remains. The layer 40Aa is lyophobic. In the region where the other photosensitive lyophilic/lyophobic base material 40A that has not been exposed to light has been removed, the surface of the other second layer 20A is exposed.

Figure 8C:
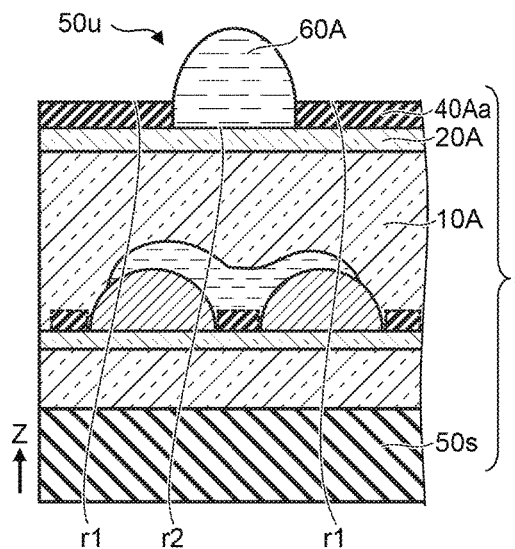

As shown in FIG. 8C, the first region r1 (region with large contact angle) is formed from the layer 40Aa (lyophilic layer) formed from the photosensitive lyophilic/lyophobic base material 40A. The second region r2 (region with small contact angle) is formed from the surface of the other second layer 20A that is exposed in the region where the photosensitive lyophilic/lyophobic base material 40A has been removed. For example, the second region r2 overlaps the semiconductor layer 62 in the Z-axis direction. In this example, using the layer 40Aa that is formed from the photosensitive lyophilic/lyophobic base material 40A as a mask, a lyophilic treatment may be carried out on the other second layer 20A. For example, an UV/O$_3$ treatment may be carried out as the lyophilic treatment.

Then, liquid 60A is coated over the upper surface of the processed body 50. The liquid 60A contacts the second region r2. The liquid 60A is, for example, Ag nano ink. For example, inkjet printing or coating printing or the like can be used for the printing. The liquid 60A is disposed on the second region r2, and substantially no liquid 60A is disposed on the first region r1.

Figure 8D:
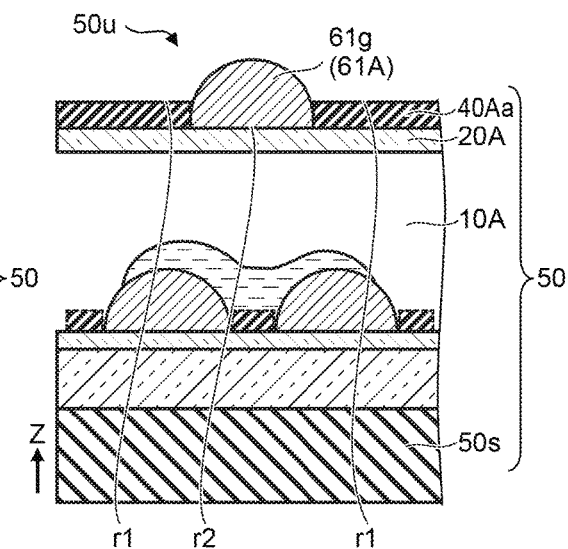

As shown in FIG. 8D, the solid 61A is formed from the liquid 60A by baking. The solid 61A forms, for example, a gate electrode 61g. In this way, a thin film transistor is formed.

In this example, a direct writing light exposure device is used in the light exposure for forming the pattern of each of the source electrode 61s, the drain electrode 61d, and the gate electrode 61g. In forming the pattern of the source electrode 61s and the drain electrode 61d, a heating process at a temperature of about 150° C. is carried out. In this heating process, non-linear deformation of about 200 to 2000 ppm is produced in the PEN or PET film substrate 50s. At this time, correction is carried out in the direct light exposure based on the measurement results of the deformation of the substrate 50s. As a result, for example, the positional accuracy of the gate electrode 61 g with respect to the source and drain electrode is, for example, 5 µm or better.

In this example, by providing the other first layer 10A and the other second layer 20A, in the pattern forming using the other photosensitive lyophilic/lyophobic base material 40A, high accuracy can be obtained. In the thin film transistor formed, the channel length is, for example, 5 µm, the source and drain electrode widths are, for example, 10 µm.

For example, in an electronic device (thin-film transistor or the like), in some cases, a lower layer electrode and an upper layer electrode are connected. At this time, a through hole is provided. Also, after forming a post, for example, the other first layer 10A and the other second layer 20A and the like are provided as described above. In forming the through hole, for example, laser abrasion may be used. For example, the other first layer 10A absorbs the laser and is abraded. On the other hand, the thickness of the other second layer 20A may be small. In the other second layer 20A, the required surface characteristics can be obtained. In this way, at the same time as carrying out abrasion of the other first layer 10A, the other second layer 20A is processed. For example, a 248 nm wavelength KrF laser can be used as the laser. At this time, the thickness of the other second layer 20A is not less than 10 nm and not greater than 200 nm, and preferably not less than 30 nm and not greater than 100 nm. When the material of the other second layer 20A is lyophilic and a good insulator, in some cases, the laser light is substantially not absorbed. In this case also, a good through hole and a good lyophilic pattern can be formed.

In the embodiment, the through hole may be formed by light exposure and developing, using a photosensitive resin as a gate insulating layer. In this case, the insulating layer (other first layer 10A) may be lyophilic. In this case, the other second layer 20A may be omitted.

When the other second layer 20A is provided, a portion to form the connection portion within the other second layer 20A may be removed by laser abrasion. In the abrasion, abrasion may also be produced in the lower layer electrode. In this case also, electrical connection can be obtained. The other second layer 20A may be a photosensitive lyophilic film. In this case, the lyophilic film need not remain at the through hole part as a result of the light exposure.

For example, by at least providing the first layer 10 with light attenuation properties, the light can be attenuated, so when forming the gate electrode, for example, irradiation of the lyophilic surface with scattered and other light from the substrate and the like can be suppressed, and the pattern accuracy can be increased. The other first layer 10A may also have light attenuation properties. As a result, in the same way, the pattern accuracy can be further improved.

The other first layer 10A has, for example, light absorbing properties. The other first layer 10A need not have light absorbing properties. For example, the light can be attenuated by at least the first layer 10, so when forming the gate electrode, the irradiation of the lyophilic surface with light can be suppressed, and the pattern accuracy can be increased.

By providing the first layer 10 between the substrate 50s and the gate electrode 61g, when the thin film transistor is being used, incidence of external light onto the semiconductor layer 62 can be suppressed. Irradiation of the semiconductor layer 62 with short wavelength light can be suppressed. When an organic semiconductor is used as the semiconductor layer 62, if short wavelength light is incident on the semiconductor layer 62, the long term reliability can be reduced. By using the first layer 10, the long term reliability is increased. By providing the first layer 10, the life of electronic devices can be increased when used under sunlight and the like.

Figure 9A:
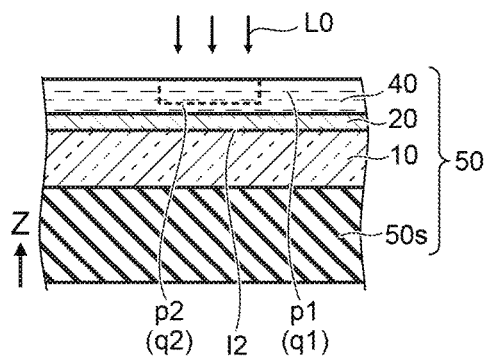
FIG. 9A and FIG. 9B are schematic cross-sectional views of a processing procedure showing another pattern forming method according to the first embodiment.
Figure 9B:
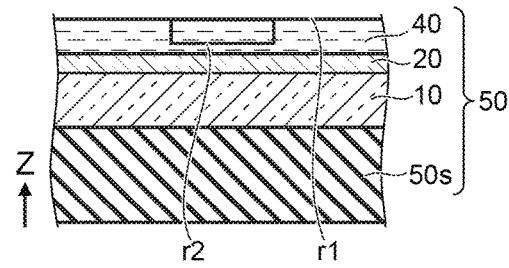

FIG. 9A and FIG. 9B are schematic cross-sectional views of a processing procedure illustrating another pattern forming method according to the first embodiment.

The first layer 10 is provided on the substrate 50s, and the second layer 20 is provided on the first layer 10. The second layer 20 is, for example, an overcoat layer of the first layer 10. The photosensitive lyophilic/lyophobic base material 40 is formed on the second layer 20. The photosensitive lyophilic/lyophobic base material 40 is formed by, for example, coating and drying. Here, the photosensitive lyophilic/lyophobic base material 40 is in the solid state. In the material of the photosensitive lyophilic/lyophobic base material 40, the surface energies of the portion irradiated with the light L0 and the portion not irradiated with the light L0 are different. A photochemical reaction is produced in the photosensitive lyophilic/lyophobic base material 40. In the portion that has been irradiated with the light L0, for example, the lyophobic components, are volatilized. The reaction may be promoted by carrying out annealing after irradiating with light. A stronger film may be formed in the photosensitive lyophilic/lyophobic base material 40 by carrying out a heating process.

The first layer 10 has attenuation properties with respect to the light L0.

As shown in FIG. 9B, after irradiating with light, the first region r1 (region with large contact angle) and the second region r2 (region with small contact angle) are formed.

In this example, in irradiating with the light L0, the light L0 that arrives in the substrate 50s is scattered, and weak light L0 may be incident on parts not exposed to light. In this way, photoreaction of the photosensitive lyophilic/lyophobic base material 40 occurs, and change of the contact angle in regions where it is not desired could occur. In particular, in a fine pattern, it is difficult to obtain the desired pattern shape. By providing the first layer 10 having light attenuation properties with respect to the exposure light, the pattern accuracy can be increased. By providing the first layer 10 and the second layer 20, the pattern accuracy can be increased.

Figure 10A:
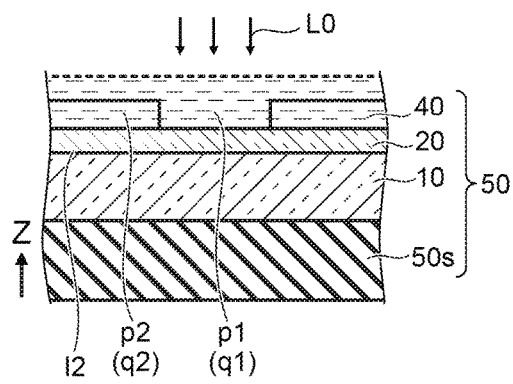
FIG. 10A and FIG. 10B are schematic cross-sectional views of a processing procedure showing another pattern forming method according to the first embodiment.
Figure 10B:
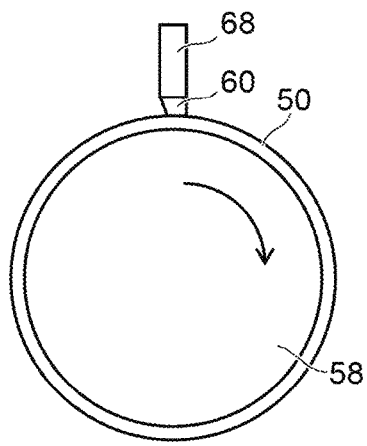

FIG. 10A and FIG. 10B are schematic cross-sectional views of a processing procedure illustrating another pattern forming method according to the first embodiment.

As shown in FIG. 10A, the first layer 10 is provided on the substrate 50s. The substrate 50s is, for example, a plate base member. The second layer 20 is provided on the first layer 10. The second layer 20 is, for example, a transfer plate member. The photosensitive lyophilic/lyophobic base material 40 is provided on the second layer 20. The first portion p1 of the photosensitive lyophilic/lyophobic base material 40 is irradiated with the light L0. The first portion p1 becomes a lyophobic region. At the portion not irradiated with the light L0, the material of the photosensitive lyophilic/lyophobic base material 40 is removed. In the removed region, the surface of the second layer 20 is exposed. The exposed surface becomes a lyophilic region. The processed body 50 becomes a lyophilic-lyophobic plate.

The second layer 20 has, for example, lyophilic properties with respect to the ink (liquid 60).

The first layer 10 has attenuation properties with respect to the light L0.

The ink (liquid 60) is disposed on the surface of the exposed second layer 20 in the required pattern configuration. The disposed ink is transferred to another object. The ink may be semi-hardened by drying or the like after coating on the plate. When transferring, the ink can be easily peeled from the surface of the second layer 20. For example, an acrylic adhesive material is used as the second layer 20. Polydimethylsiloxane (PDMS) is used as the second layer. The substrate 50s may, for example, be a single substrate member. The substrate 50s may be a laminated body. For example, a base member is provided in the laminated body. At least either of a cushion layer and an elastic layer is provided in the laminated body. These members have, for example, optical transparency and scattering properties. In this case, by providing the first layer 10, it is possible to suppress changes of the contact angle from the desired state on the surface of the pattern. A fine pattern can be formed, and the pattern accuracy can be improved.

The processed body 50 may be used in a plane state. The processed body 50 may be used in a curved state (for example, circular cylindrical state).

As shown in FIG. 10B, the processed body 50 is wound around a drum 58. The processed body 50 becomes a roll plate. Ink (liquid 60) is supplied from an ink supply mechanism 68. An ink pattern is formed on the surface of the processed body 50. The formed ink is transferred to another object. The ink may be substantially coated onto the surface of the processed body 50 by, for example, capillary coating. The ink may be coated onto a portion of the processed body 50 by, for example, an inkjet or the like. In this way, the embodiment may be applied to a transfer plate.

Figure 11:
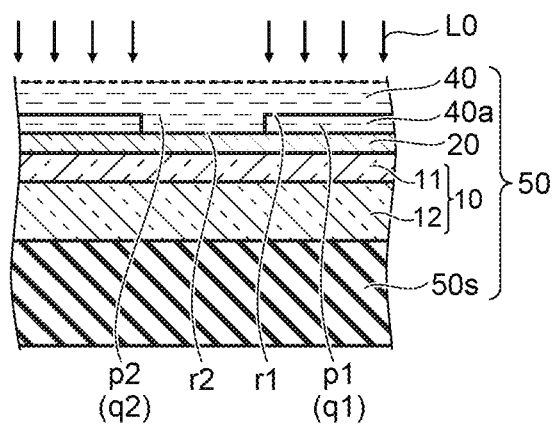
FIG. 11 is a schematic cross-sectional view of a processing procedure showing another pattern forming method according to the first embodiment.

FIG. 11 is a schematic cross-sectional view of a processing procedure illustrating another pattern forming method according to the first embodiment.

As shown in FIG. 11, the substrate side region 12 is provided on the substrate 50s as a portion of the first layer 10. An adhesion layer (the intermediate layer 51 illustrated in FIG. 7B) may be provided between the substrate 50s and the substrate side region 12. The upper region 11 layer is provided on the substrate side region 12 layer. For example, a resin with good insulating properties may be used as the upper region 11 layer. For example, a resin that includes fluorine is used as the upper region 11 layer. A film with low leakage current and low dielectric loss is used as the upper region 11 layer. The dielectric constant of the upper region 11 layer may be set so that the required characteristics are obtained. In this case, the thickness of the upper region 11 layer is, for example, not less than 100 nm and not greater than 10 μm.

The second layer 20 is provided on the upper region 11 layer. The second layer 20 has, for example, a thickness that enables a lyophilic surface to be obtained. The thickness of the second layer 20 is, for example, not less than 10 nm and not greater than 100 nm. The material of the second layer 20 is selected taking into consideration the lyophilic properties. The range of options for selection of the material of the second layer 20 is broad. The second layer 20 is formed, for example, by coating and drying.

The photosensitive lyophilic/lyophobic base material 40 is formed on the second layer 20. For example, the photosensitive lyophilic/lyophobic base material 40 has photo-hardening properties. A portion of the photosensitive lyophilic/lyophobic base material 40 is hardened by irradiation with the light L0 corresponding to a predetermined pattern. A lyophobic film (layer 40a, first region r1) is formed with the predetermined shape. The surface of the second layer 20 is exposed in the region where the photosensitive lyophilic/lyophobic base material 40 has been removed by cleaning or by volatilization. The exposed surface becomes a lyophilic film (second region r2).

The first layer 10 has attenuation properties with respect to the light L0.

In this example, by providing the upper region 11 layer, a good pattern can be obtained while obtaining the desired functionality. The desired function includes at least either of, for example, an electrical function and an optical function.

In this example, the material of the upper region 11 layer is different from the material of the second layer 20. Their refractive indices are different from each other. For example, the thickness of the second layer 20 may be set so that there is interference and reflection of the light L0. The quantity of the light L0 that arrives at the first layer 10 and the substrate 50s is reduced by reflection. The accuracy of the pattern is improved.

The light L0 is reflected between the substrate side region 12 layer and the upper region 11 layer. The reflected light is incident on the first portion p1 of the photosensitive lyophilic/lyophobic base material 40 from below. The reactivity is substantially increased in the photosensitive lyophilic/lyophobic base material 40. For example, the second layer 20 can be easily made thinner. In this way, the thickness of the second layer 20 can be easily made to satisfy the reflection conditions. The desired pattern can be obtained with high sensitivity. For example, a lyophilic pattern with good wettability can be obtained with high sensitivity.

For example, a polystyrene resin that includes fluorine may be used as the upper region 11 layer. The thickness of the upper region 11 layer is not less than 600 nm and not greater than 800 nm. The contact angle of tetradecane with the second layer 20 is not larger than 6 degrees. The thickness of the second layer 20 is not less than 50 nm and not greater than 70 nm. For example, a reflectance of not less than 5% can be obtained from this configuration. For example, the quantity of the light L0 used in forming the pattern (exposure light quantity, in other words, the sensitivity) can be improved by not less than 20%.

Figure 12:
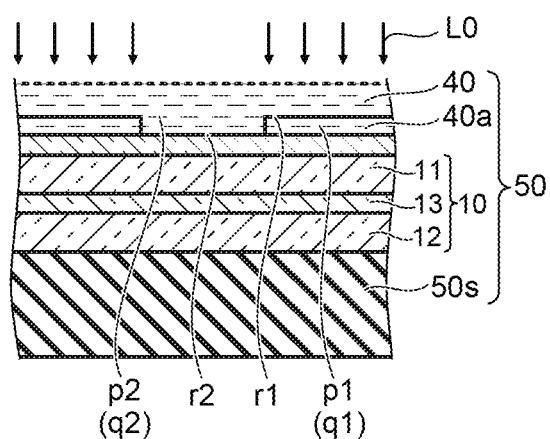
FIG. 12 is a schematic cross-sectional view of a processing procedure showing another pattern forming method according to the first embodiment.

FIG. 12 is a schematic cross-sectional view of a processing procedure illustrating another pattern forming method according to the first embodiment.

As shown in FIG. 12, the first layer 10 is provided on the substrate 50s, the second layer 20 is provided on the first layer 10, and the photosensitive lyophilic/lyophobic base material 40 is provided on the second layer 20. In this example, the first layer 10 includes the upper region 11 layer, the substrate side region 12 layer, and an intermediate region 13 layer. The intermediate region 13 layer is disposed between the upper region 11 layer and the substrate side region 12 layer.

The first layer 10 has attenuation properties with respect to the light L0 in at least one layer of the stack that includes the upper region layer 11, the substrate site region layer 12, and the intermediate region layer 13.

The first layer 10 has a multilayer structure that includes a plurality of layers. The refractive indices of the plurality of layers are different from each other. The desired interference conditions are easily obtained. The reflectance is increased by multiple interference. The margin with respect to fluctuations in the thicknesses of the plurality of layers is large.

At least a portion of the first layer 10 may include nano particulates. The nano particulates are, for example, dispersed. In this way, for example, ultraviolet light is easily reflected. A pattern forming method can be provided in which the accuracy can be improved.

(Second Embodiment)

FIG. 13A to FIG. 13F are schematic cross-sectional views of a processing procedure illustrating a pattern forming method according to a second embodiment.

These drawings illustrate a fifth method PR5.

Figure 13A:
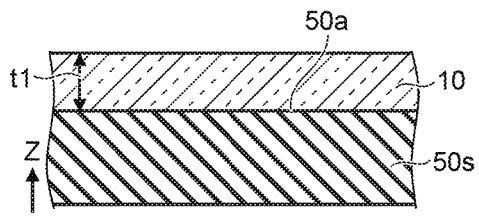
FIG. 13A to FIG. 13F are schematic cross-sectional views of a processing procedure showing a pattern forming method according to a second embodiment.

As shown in FIG. 13A, the first layer 10 having the first refractive index is formed on the first face 50a of the substrate 50s. The first layer 10 has the first thickness t1.

Figure 13B:
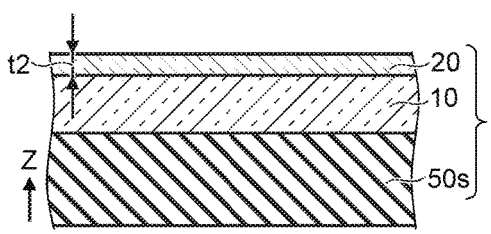

As shown in FIG. 13B, the second layer 20 having the second refractive index is formed on the first layer 10. The second refractive index is different from the first refractive index. Thereby, the processed body 50 is formed. In this example, the second thickness t2 of the second layer 20 is less than the first thickness t1.

In other words, the fifth method PR5 includes a process of preparing the processed body that includes the substrate 50s having the first face 50a, the first layer 10 provided on the first face 50a and having the first refractive index, and the second layer 20 provided on the first layer 10 and having the second refractive index different from the first refractive index.

Figure 13C:
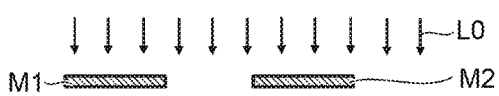
Figure 13C:
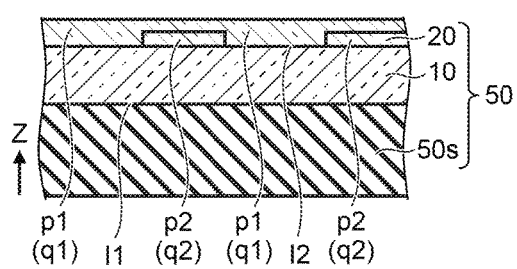

As shown in FIG. 13C, one of the first portion p1 at the first position q1 of the second layer 20, and the second portion p2 at the second position q2 of the second layer 20 is irradiated with the light L0. In this example, the first portion p1 is irradiated with the light L0. The second portion may be removed by, for example, at least either of cleaning and heating. This process corresponds to the first process.

The first layer 10 has attenuation properties with respect to the light L0.

Figure 13D:
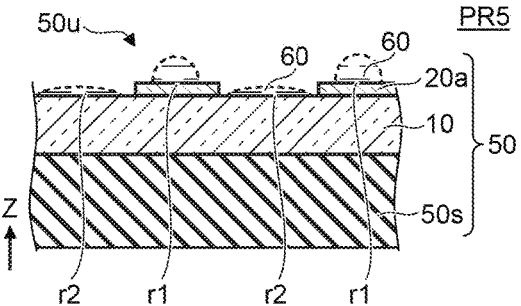

As shown in FIG. 13D, in the first process, the first contact angle of the liquid 60 on the first region r1 of the upper surface 50u of the processed body 50 is made relatively larger than the second contact angle of the liquid 60 on the second region r2 of the upper surface 50u. The first region r1 overlaps the first position q1 in the first direction (Z-axis direction) which is perpendicular to the first face 50a. The second region r2 overlaps the second position q2 in the first direction. In FIG. 13D, the differences in contact angles are indicated by drawing the liquid 60. In the first process, the liquid need not be disposed on the upper surface 50u of the processed body 50.

Figure 13E:
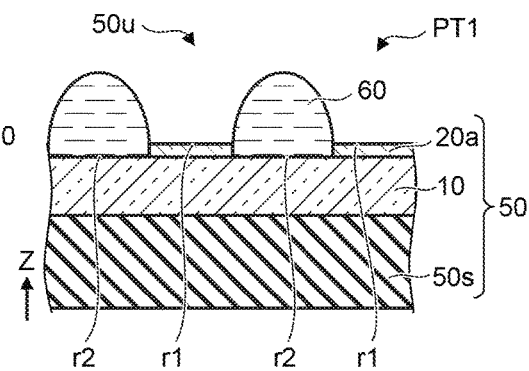

As shown in FIG. 13E, the first pattern PT1 is formed by bringing the liquid 60 into contact with the second region r2. This process corresponds to the first pattern forming process. The first pattern PT1 includes at least a portion of the first region r1, and the liquid 60 on at least a portion of the second region r2.

Figure 13F:
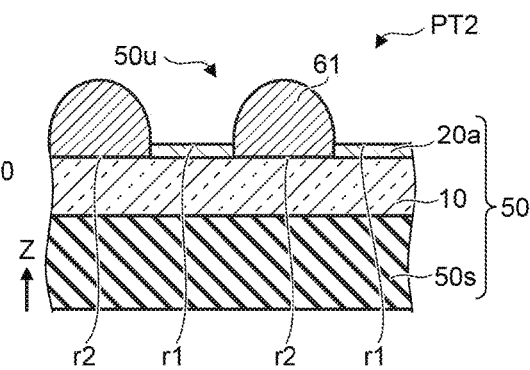

As shown in FIG. 13F, the solid 61 is formed from at least a portion of the liquid 60 on at least a portion of the second region r2. In this way, the second pattern PT2 that includes the solid 61 is formed. This process corresponds to the second pattern forming process.

In the embodiment, for example, the light L0 is reflected at the interface I2 between the first layer 10 and the second layer 20, and is again incident on the second layer 20. The sensitivity of the second layer 20 is substantially increased. For example, the light L0 incident on the first layer 10 is attenuated through the first layer 10. The light L0 reflected at the interface I1 between the first layer 10 and the substrate 50s is attenuated as it travels in the upward direction. As a result, the incidence of the light L0 reflected at the interface I1 onto regions where it is not desirable (for example, the second portion p2) is suppressed. In the embodiment, a pattern forming method can be provided in which the accuracy can be improved.

In this example, the first layer provided on the substrate 50s functions as a light attenuating layer (for example, a light cutting layer) with respect to the light L0 irradiated onto the second layer 20. The first layer 10 also functions as a lyophilic film. For example, the first portion p1 of the second layer 20 is photo-hardened. The second portion p2 of the second layer 20 is removed by a solvent. The second portion p2 may also be removed by volatilization. In this way, a portion of the surface of the first layer 10 is exposed. The exposed surface of the first layer 10 becomes the second region r2. The first portion p1 becomes the first region r1.

For example, a polystyrene insulating material is used as the material of the first layer 10. This material includes a polymer chain. The polymer chain includes, for example, an ultraviolet light absorbing functional group. The first layer 10 includes the function of a lyophilic film and the function of a light attenuation layer. The first layer 10 may include an acrylic resin. The acrylic resin includes, for example, an ultraviolet light absorbing functional group. The first layer 10 may include a polyimide. In this way also, the ultraviolet light is attenuated. The first layer 10 can be provided with light attenuation properties and lyophilic properties.

In at least any of the substrate 50s, the first layer 10, and the second layer 20 according to the second embodiment, the configurations described for the first embodiment may be applied.

In the second embodiment, the second layer 20 has photo-reactive properties. The second layer 20 may be a negative type or a positive type with respect to light. In the second layer 20, the contact angle on the portion irradiated with light may be larger than or may be smaller than the contact angle on the portion not irradiated with light. The contact angle on the first layer 10 is different from the contact angle on either of the first portion p1 and the second portion p2 of the second layer 20.

According to the pattern forming method of the second embodiment, a pattern forming method can be provided in which the accuracy can be improved.

(Third Embodiment)

The embodiment relates to a pattern structural body. The pattern structural body includes, for example, the first pattern PT1 described for the first and second embodiments.

For example, as shown in FIG. 1F, the pattern structural body includes the substrate 50s having the first face 50a, the first layer 10 provided on the first face 50a and having the first refractive index, the second layer 20 provided on the first layer 10 and having the second refractive index different from the first refractive index, and the pattern (first pattern PT1) that includes the first region r1 and the second region r2 provided on the second layer 20.

The contact angle of the liquid 60 on the first portion r1 is larger than the contact angle of the liquid 60 on the second region r2 (for example, see FIG. 1E).

The first layer 10 has attenuation properties with respect to the light L0. For example, the attenuation rate of the first layer 10 with respect to the light L0 is not lower than 50%. The transmittance of the first layer 10 with respect to the light L0 is less than 50%. The light L0 is the light used for light exposure. The wavelength of the light L0 is not longer than 370 nm. The reflectance of the stacked body (for example, the processed body 50) with respect to the light L0 is not less than 5%. A pattern structural body can be provided in which the accuracy can be improved.

According to the embodiment, a pattern forming method capable of improving the accuracy and a pattern structural body can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in pattern structural bodies such as substrates, memory strings, memory cells, first layers, second layers, photosensitive lyophilic/lyophobic base materials, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all pattern forming methods and pattern structural bodies practicable by an appropriate design modification by one skilled in the art based on the pattern forming methods and the pattern structural bodies described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A pattern forming method, comprising:
   preparing a first processed body including a substrate, a first electrode, a second electrode, an organic semiconductor layer, a first layer, a second layer, and a first photosensitive lyophilic/lyophobic original material, the substrate having a first face and including a resin, the substrate including a first partial region, a second partial region, and a third partial region provided between the first partial region and the second partial region, the first electrode being provided above the first partial region, the second electrode being provided above the second partial region and being apart from the first electrode, the organic semiconductor layer being provided above at least a part of the first electrode, above at least a part of the second electrode, and above the third partial region, the first layer being provided above the organic semiconductor layer, the second layer being provided above the first layer, the first lyophilic/lyophobic original material being provided above the second layer, the first layer including a first upper region in contact with the second layer and having a first refractive index, and the second layer having a second refractive index different from the first refractive index;
   performing a first process of irradiating a first light onto a first portion at a first position of the photosensitive lyophilic/lyophobic original material to harden at least a part of the first portion, and removing a second portion at a second position of the photosensitive lyophilic/lyophobic original material, and making a first contact angle of a first liquid with a first region of a first upper face of the first processed body relatively larger than a second contact angle of the first liquid with a second region of the first upper face, a direction from the second position toward the first position being along the first face, the first region overlapping the first position in a first direction perpendicular to the first face, and the second region overlapping the second position in the first direction;
   performing a first pattern forming process of forming a first pattern by bringing the first liquid into contact with the second region, the first pattern including at least a portion of the first region and the first liquid above at least a portion of the second region;
   performing a second pattern forming process of forming a first solid from at least a part of the first liquid above the at least the part of the second region to make a third electrode including the first solid, the first solid being conductive,
   an attenuation rate of the first layer with respect to the first light being not less than 50%,
   a peak wavelength of the first light being not more than 370 nm,
   the first layer including a first polystyrene resin, and
   the second layer including a second polystyrene resin without fluorine.

2. The method according to claim 1, wherein a second thickness of the second layer is less than a first thickness of the first layer.

3. The method according to claim 1, wherein the attenuation rate of the first layer with respect to the first light is higher than an attenuation rate of the second layer with respect to the first light.

4. The method according to claim 1, wherein the substrate generates fluorescent light.

5. The method according to claim 1, wherein a transmittance of the first layer with respect to visible light is higher than a transmittance of the first layer with respect to an ultraviolet light.

6. The method according to claim 1, wherein the bringing the first liquid into contact with the second region includes performing an inkjet printing of the first liquid.

7. The method according to claim 1, wherein the preparing the first processed body includes:
   preparing a second processed body including the substrate, a third layer, a fourth layer, and a second photosensitive lyophilic/lyophobic original material, the third layer being provided above the substrate, the fourth layer being provided above the third layer, the second photosensitive lyophilic/lyophobic original material being provided above the fourth layer, the third layer including a second upper region in contact with the fourth layer and having a third refractive index, the fourth layer having a fourth refractive index different from the third refractive index,
   performing a second process of irradiating a second light onto a third portion at a third position of the second photosensitive lyophilic/lyophobic original material to harden at least a part of the third portion, and removing a fourth portion at a fourth position of the second lyophilic/lyophobic original material, and making a third contact angle of a second liquid with a third region of a second upper face of the second processed body relatively larger than a fourth contact angle of the second liquid with a fourth region of the second upper face, a direction from the fourth position toward the third position being along the first face, the third region overlapping the third position in the first direction, and the fourth region overlapping the fourth position in the first direction;

performing a third pattern forming process of forming a third pattern by bringing the second liquid into contact with the fourth region, the third pattern including at least a portion of the third region and the second liquid above at least a portion of the fourth region; and performing a fourth pattern forming process of forming a second solid from at least a part of the third liquid above the at least the part of the fourth region to make the first electrode including the second solid and to make the second electrode including the second solid, the second solid being conductive, an attenuation rate of the third layer with respect to the second light is not less than 50%, a peak wavelength of the second light is not more than 370 nm.

8. The method according to claim 7, wherein the third layer includes an acrylic resin.

* * * * *